(12) United States Patent
Arnold et al.

(10) Patent No.: US 7,642,549 B2
(45) Date of Patent: Jan. 5, 2010

(54) PHASE CHANGE MEMORY CELLS DELINEATED BY REGIONS OF MODIFIED FILM RESISTIVITY

(75) Inventors: John Christopher Arnold, North Chatham, NY (US); Tricia Breen Carmichael, Windsor (CA)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/407,068

(22) Filed: Mar. 19, 2009

(65) Prior Publication Data

US 2009/0179186 A1 Jul. 16, 2009

Related U.S. Application Data

(62) Division of application No. 11/781,239, filed on Jul. 21, 2007, now Pat. No. 7,550,313.

(51) Int. Cl.
*H01L 29/08* (2006.01)
*H01L 29/18* (2006.01)
(52) U.S. Cl. .......... 257/42; 257/E31.008; 257/E31.029; 257/E29.087; 438/84; 438/95; 977/734
(58) Field of Classification Search .................. 257/42, 257/E21.008, E31.029, E29.087; 438/84, 438/95; 977/734

See application file for complete search history.

(56) References Cited

U.S. PATENT DOCUMENTS

| 5,296,716 | A | 3/1994 | Ovshinsky |
| 5,874,760 | A | 2/1999 | Burns et al. |
| 2006/0192193 | A1* | 8/2006 | Lee et al. ........................ 257/2 |
| 2006/0249724 | A1 | 11/2006 | Krusin-Elbaum et al. |
| 2006/0279978 | A1 | 12/2006 | Krusin-Elbaum et al. |
| 2007/0018202 | A1 | 1/2007 | Zhu |
| 2007/0025144 | A1 | 2/2007 | Hsu et al. |
| 2007/0025170 | A1 | 2/2007 | Barth et al. |
| 2007/0099347 | A1 | 5/2007 | Pellizzer et al. |
| 2009/0001337 | A1 | 1/2009 | Furukawa et al. |

OTHER PUBLICATIONS

Stefan Lai et al., "Current Status of the Phase Change Memory and its Future," Electron Devices Meeting, 2003, IEDM '03 Technical Digest, IEEE International (Dec. 8-10, 2003) pp. 10.1.1-10.1.4.

* cited by examiner

*Primary Examiner*—Thanh V Pham
(74) *Attorney, Agent, or Firm*—Graham S. Jones, II; Daniel P. Morris; Robert M. Trepp

(57) ABSTRACT

A Phase Change Memory (PCM) cell structure comprises both a lower electrode composed of a PCM layer and a conductive encapsulating upper electrode layer. The PCM layer is protected from damage by the conductive encapsulating layer. Electrical isolation between adjacent PCM cells is provided by high electrical resistance regions which were formed by modifying the conductivity of both the PCM layer and the conductive encapsulating upper electrode layer subsequent to deposition thereof.

20 Claims, 18 Drawing Sheets

| PHASE CHANGE MATERIALS | | |
|---|---|---|
| Binary | Ternary | Quaternary |
| GaSb | $Ge_2 Sb_2 Te_5$ | Ag In Sb Te |
| In Sb | In Sb Te | (Ge Sn) Sb Te |
| In Se | Ga Se Te | Ge Sb (Se Te) |
| $Sb_2Te_5$ | Sn $Sb_2 Te_4$ | $Te_{81} Ge_{15} Sb_2 S_2$ |
| Ge Te | In Sb Ge | |

FIG. 12

PHASE CHANGE MEMORY CELLS DELINEATED BY REGIONS OF MODIFIED FILM RESISTIVITY

RELATED APPLICATION

This application is a divisional application of U.S. application Ser. No. 11/781,239 filed Jul. 21, 2007, now U.S. Pat. No. 7,550,313 and assigned to IBM. The disclosure of the foregoing application is incorporated herein by reference.

The present invention relates generally to memory devices, and more particularly to Phase Change Memory (hereafter PCM) cells and methods of making and using them.

BACKGROUND OF THE INVENTION

Binary Phase Change Memory (PCM) cells store information with chalcogenide material which transitions reversibly between high and low resistivity states. In a PCM cell which is electrically-probed, the PCM material is inserted in an electrical circuit to measure the resistance of the Phase Change Element (PCE.) In a conventional planar PCM cell, the PCE comprises a film deposited parallel to the plane of a substrate and the PCE is connected to an electrical circuit via a conductive upper and lower electrodes.

There are significant advantages to Random Access Memory (RAM) devices composed of a nonvolatile chalcogenide material, e.g. $Ge_2Sb_2Te_5$, which transitions between a low resistivity crystalline state and a high resistivity amorphous state. The term "chalcogen" refers to the Group VI elements of the periodic table. Chalcogenide materials comprise alloys of at least one of the Group VI elements, e.g. germanium, antimony, and tellurium.

In the past, chalcogenide materials have been used in PCM devices, especially in the rewritable CD and DVD disks. When a PCM device is employed in semiconductor chips, there are many advantages over other types of memory devices in areas such as scalability, high sensing margin, low energy consumption and cycling endurance. In a common design for chalcogenide memory cells, the data is stored in a flat chalcogenide layer deposited near the end of the Complementary Metal Oxide Semiconductor (CMOS) interconnect process making it ideal for embedded applications. A chalcogenide memory element can be programmed and reprogrammed into high/low resistance states. When a chalcogenide material is in the amorphous phase (known as the RESET state) it has high resistance; but when it is in the crystalline phase, it has low resistance (known as the set state). The ratio of currents between the SET state and the RESET state can be greater than 1,000 times, which provides high sensing margins.

FIG. 1 contrasts the I-V characteristic of a chalcogenide material in the polycrystalline state with the characteristic in the amorphous state. On the one hand, the amorphous state remains near zero in the low voltage region A1, but in the same low voltage region the polycrystalline state material increases in current in the low voltage region B1. On the other hand the amorphous state matches the polycrystalline state B2 in the higher voltage region A2. When the voltage applied to the amorphous material exceeds the threshold voltage (Vt), threshold switching occurs and the material turns into a dynamic "ON" state. In the ON state, the carrier concentration is high and the resistance is as low as it is in the crystalline state.

FIG. 2 shows the curves of temperature vs time for an amorphizing RESET pulse and for a crystallizing SET pulse in a chalcogenide memory element. Adequate energy must be driven into the chalcogenide PCE to change its state from RESET to SET in the dynamic ON state (i.e. for a device in the RESET state.) As shown in FIG. 2, to ensure such "SET programming," the device temperature must be above the crystallization temperature (Tx) and must be retained, i.e. held, thereabove for time interval (t2) which is the minimum time period required to complete the process of SET the device.

On the other hand, as shown in FIG. 2, for a "RESET program" in which a PCE in a PCM cell is changed from a SET to a RESET state, sufficient energy must also be driven into the chalcogenide memory element and the local temperature must be raised above the melting temperature (Tm). A shorter period of time should be spent above the temperature Tm to avoid heating the surrounding materials. It is critical that rapid quenching during a very short time interval (t1) is required after the local heating to return to the RESET state in which the material of the PCE is in its amorphous phase.

Because the rate of Joule heating of the material of a chalcogenide PCE during the RESET and SET cycles is determined largely by current density, reducing the contact area between the chalcogenide material of the PCE and the adjacent electrode is sufficient to reduce the switched volume. During the RESET cycle, for example, it is not necessary to melt the entire volume of the PCE material if the current density, and thus Joule heating rate, and thus material temperature, is high enough to melt the PCE material near one of the electrodes. After enough PCE material has been amorphized to span the breadth of the current path through the cell, the overall resistance of the PCM cell will be high. Similarly, during the SET cycle, the overall PCM cell resistance will fall once a sufficiently broad path of crystalline material is formed. In both cases, adjacent material may be left in the opposite state without significantly affecting the overall cell resistance.

To read a chalcogenide PCM device, a "read" voltage is applied thereto. Thus, one can sense the current difference resulting from the different device resistance. The read voltage must be lower than the threshold voltage (e.g. 1.2V) to avoid changing the state of the PCE material.

Currently, chalcogenide materials are used in reversible optical information storage elements such as CD-RW and DVD-RW disks. Compounds such as germanium-antimony-tellurium, i.e. Ge2Sb2Te5 (GST,) can change phase from an amorphous state to a crystalline state in about 50 ns after proper exposure to a laser beam. However, there is the problem that with thinner films the crystallization speed of a GST material tends to decrease. To avoid reduced crystallization speed, tin (Sn) metal is doped into a Ge—Sb—Te compound forming a Ge—Sb—Sn—Te (GSSnT) alloy, increasing the crystallization speed.

FIG. 12 is a table of examples of various binary, ternary and quarternary PCM alloys suitable for use in PCM cells.

FIG. 3 shows a simplified cell structure of chalcogenide memory device comprising a conventional Metal Oxide Semiconductor Field Effect Transistor (MOSFET) transfer transistor TT, and a PCE ME. The source region S of the MOSFET transistor TT is connected through a via stud BLS to a metal bit-line wire BL. The drain region D of the MOSFET transistor TT is connected through a via stud DS to the bottom electrode BE of the PCE ME. The gate electrode GE of the transfer transistor TT is connected through a via stud WLS to a metal word-line WL. The PCE ME comprises a sandwich of a top electrode TE, a chalcogenide dielectric material CH and the bottom electrode BE. Both the top and bottom electrodes TE and BE are made of metal or refractory metal, while the dielectric material CH comprises a thin layer of a chalcogenide material. The top electrode TE is connected through a via stud SRS to a Set-Reset Line SRL.

FIG. 4 is a graph of resistance as a function of the number of cycles of operation of a PCM cell for both the SET resistance and RESET resistance which shows the cycling endurance of a chalcogenide PCM cell over many cycles, as reported by Stefan Lai, et al., in "Current Status of the Phase Change Memory and its Future," Electron Devices Meeting, 2003. IEDM '03 Technical Digest, IEEE International 8-10 Dec. 2003 Page(s):10.1.1-10.1.4. Thus, one can conduct SET/RESET cycles for a lifetime of more than 1E12 times which is much higher than the lifetime of about 1E5 cycles of a conventional flash memory device.

FIGS. 5A and 5B show two alternative prior art PCM cell designs which employ edge contact to reduce switching current and which are described by Lai et al. cited above. As employed in FIGS. 5A and 5B based upon the Lai et al. paper, there is the top metallization M1, and the bottom metallization M0. Several electrodes are provided including a top electrode TE, a top electrode contact TEC, a bottom electrode BE, and a bottom electrode contact BEC. The PCM (Phase Change Material) is composed of GST as indicated in FIGS. 5A and 5B. Cells of this design are quite common in the literature.

To prevent interference by altering the resistance as a result of interaction with neighboring cells in a multi-bit device, adjacent memory cells must be isolated from each other electrically. This is conventionally accomplished by patterning the PCM materials and the electrode films, typically by a subtractive process such as etching or Chemical-Mechanical Polishing (CMP). Initially, the PCM and electrode materials are deposited as continuous films. Then, subsequently portions of those films are removed between adjacent cells to provide separate cells adjacent to each other.

One difficulty with conventional methods for cell delineation is that the PCM materials are typically fragile and easily damaged by chemicals used in the etching or CMP polishing processes and subsequent cleaning steps. We have observed that the sidewalls of the PCM layers are exposed to attack by chemicals which can alter the characteristics thereof.

SUMMARY OF THE INVENTION

This invention reduces the opportunity for chemical damage to the Phase Change Memory (PCM) layer during cell delineation by encapsulating the PCM material layer with a protective layer after deposition and retaining that protective layer throughout subsequent processing. Electrical isolation of adjacent PCM cells is accomplished by treating the device being processed to form isolation regions in both the PCM layer and encapsulating layer. The isolation regions are formed by transforming those layers in such regions into materials with high resistance between adjacent PCM cells. The presence of the transformed high resistance regions between PCM cells constrains both writing and sensing currents to the chosen individual cell without exposing the sensitive PCM material layer to subsequent chemical processing. The preferred method for modulating film resistance is implantation of ions (including but not limited to oxygen) into intermediate portions of conductive layers and the PCM layer aside from the locations of PCM cells to convert the intermediate portions of the conductive layers and the PCM layer into insulators.

In an alternative embodiment, the encapsulating layer is deposited as an insulator and is subsequently converted into a conductive form within the memory cells during subsequent processing.

In accordance with this invention, a Phase Change Memory (PCM) device comprises a substrate having an upper surface and including a set of electrical via conductors formed therein having exposed top surfaces. A PCM material layer is formed on the upper surface in electrical contact with the exposed top surfaces of the via conductors. An encapsulating layer composed of an electrically conductive material is formed on top of the PCM material layer. A set of PCM cells is formed by portions of the encapsulating layer and portions of the PCM material layer in contact with the top surface of the electrical conductors; and the PCM cells are separated by high electrical resistance regions of the PCM material layer and high electrical resistance regions of the encapsulating layer. Preferably, the encapsulating layer formed is selected from the group consisting of conductors and semiconductor materials; and the PCM material layer is composed of a chalcogenide material. It is also preferred that the high electrical resistance regions of the PCM material layer and the high electrical resistance regions of the encapsulating layer comprise ion implanted and annealed regions. Preferably, the ions are selected from the group consisting of oxygen, nitrogen, and carbon; and the high electrical resistance regions of the PCM material layer and the high electrical resistance regions of the encapsulating layer comprise oxygen ion implanted and annealed regions.

Further in accordance with this invention, a Phase Change Memory (PCM) device comprises a dielectric layer having an upper surface; a set of electrical via conductors extending through the dielectric layer to the upper surface; with each of the electrical via conductors having top surfaces. A PCM material layer is formed on the upper surface in electrical contact with the top surfaces of the via conductors. An encapsulating layer which is composed of an electrically conductive material is formed on top of the PCM material layer. A set of PCM cells is formed by portions of the encapsulating layer and portions of the PCM material layer in contact with the top surface of the via conductors. The PCM cells are separated by high electrical resistance regions of the PCM material layer and high electrical resistance regions of the encapsulating layer. Preferably, the encapsulating conductive material layer formed is selected from the group consisting of conductors and semiconductor materials; and the PCM material layer is composed of a chalcogenide material. Preferably, the high electrical resistance regions of the PCM material layer and the high electrical resistance regions of the encapsulating layer have been implanted with ions. It is preferred that the ions are selected from the group consisting of oxygen, nitrogen, and carbon; and the high electrical resistance regions of the PCM material layer and the high electrical resistance regions of the encapsulating layer comprise oxygen ion implanted and annealed regions.

In accordance with another aspect of this invention, a method is provided for forming a plurality of Phase Change Memory (PCM) cells, with the PCM cells in electrical contact with a set of electrical conductors which have exposed top surfaces. A substrate has an upper surface and with the PCM cells being located in inboard regions above the electrical conductors and the substrate aside from outboard regions. The method involves the processing steps of forming a bilayer on the upper surface of the substrate, the bilayer comprising a PCM material layer in electrical contact with the top surfaces of the via conductors extending across the inboard and the outboard regions and an encapsulating layer composed of an electrically conductive material on top of the PCM material layer extending across the inboard and outboard regions in outboard regions aside from the inboard regions. The process continues by implanting ions into the encapsulating layer and the PCM material layer to form high electrical resistance regions of the PCM material layer and high electrical resistance regions of the encapsulating layer aside with the PCM cells being formed as separate cells in the inboard regions from portions of the encapsulating layer and portions of the PCM material layer in contact with the top surface of the electrical conductors and forming resistive material from portions of the encapsulating layer and portions of the PCM material layer in the outboard regions. Preferably, the ions are selected from the group consisting of oxygen, nitrogen, and carbon; and continuously conductive contacts are formed extending through the PCM material layer to underlying circuitry by forming PCM material elements of sufficiently large cross-sectional area to prevent switching during PCM cell operation. Preferably, the encapsulating conductive material layer formed is selected from the group consisting of conductors and semiconductor materials; and the PCM material layer is composed of a chalcogenide material. It is also preferred that the ions are selected from the group consisting of oxygen, nitrogen, and carbon.

In accordance with another aspect of this invention, a method is provided for forming a plurality of Phase Change Memory (PCM) cells, in inboard regions separated by resistive material in outboard regions juxtaposed therewith. The method includes steps of forming in a substrate with a top surface a set of lower electrodes with exposed upper surfaces in the top surface; forming a bilayer on the top surface and on the upper surfaces of the lower electrodes, the bilayer comprising a PCM material layer in contact with the upper surfaces of the lower electrodes and a conductive upper electrode layer over the PCM material layer; and lowering the electrical conductivity of outboard regions of the PCM material layer and lowering the electrical conductivity of outboard regions of the upper electrode aside from the lower electrodes by implantation of ions therein and annealing to modify the material composition of the outboard regions with the inboard regions having been formed as PCM cells separated by the PCM material layer and the upper electrode layer in the outboard regions. Preferably, form continuously conductive contacts through the planar region to underlying circuitry are created by forming PCM material elements of sufficiently large cross-sectional area to prevent switching during PCM cell operation. It is preferred to form continuously conductive contact openings extending through the planar region to underlying circuitry by removing the bilayer in the continuously conductive contact openings to prevent switching during PCM cell operation; and that the ions are selected from the group consisting of oxygen, nitrogen, and carbon. Preferably, the conductive upper electrode layer is composed of a material selected from the group consisting of conductors and semiconductor materials; and the PCM material layer is composed of a chalcogenide material.

BRIEF DESCRIPTION OF THE FIGURES

FIG. 12 is a table of examples of various binary, ternary and quarternary PCM alloys suitable for use in PCM cells.

DETAILED DESCRIPTION OF PREFERRED EMBODIMENTS OF THE INVENTION

The present invention provides an improved process for fabricating a Phase Change Memory (PCM) device, i.e. a PCM cell structure and integrating it with other circuitry. By protecting the fragile phase change material throughout processing, this invention improves the manufacturability and reliability of the PCM cells.

Prior art structures all involve some exposure of the PCM material to processing chemicals either during delineation of the memory cell or during subsequent processing. Such exposure can cause etching, corrosion, oxidation, surface roughening, changes in stoichiometry, and other effects which may cause the memory element to fail during fabrication or use.

Figure 6A:
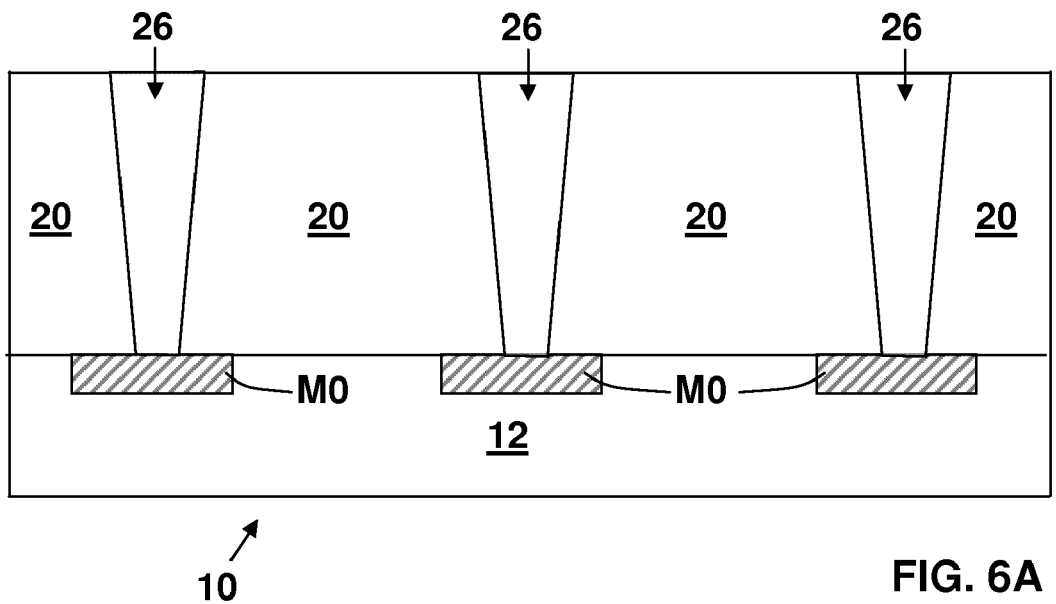
FIGS. 6A-6K show cross-sectional views of the processing steps employed to form a PCM device with three PCM cells; starting with three vias formed in an ILD layer upon which a PCM material layer and a conductive encapsulating layer are formed; which are separated subsequently by increasing the resistance of the PCM material and the conductive encapsulating layer aside from the local regions of the PCM cells.

FIG. 6A is a cross-sectional view of a PCM cell 10 in an early stage of manufacture. The process starts with step AA in FIG. 7 with a substrate 12 which has been processed previously to have M0 electrical metallization elements formed on the surface thereof. Step AA begins with coating exposed surfaces of the substrate 12 and the exposed surfaces of the M0 electrical metallization elements which are electrical conductors with an Inter Level Dielectric (ILD) insulator layer 20 layer. Step AA also involves formation of a set of three lower via holes 26 extending down through the ILD layer 20 to expose at least portions of the top surfaces of the M0 electrical metallization elements. The ILD insulator layer 20 may be composed of a material such as silicon dioxide, or another dielectric insulator materials.

Figure 6B:
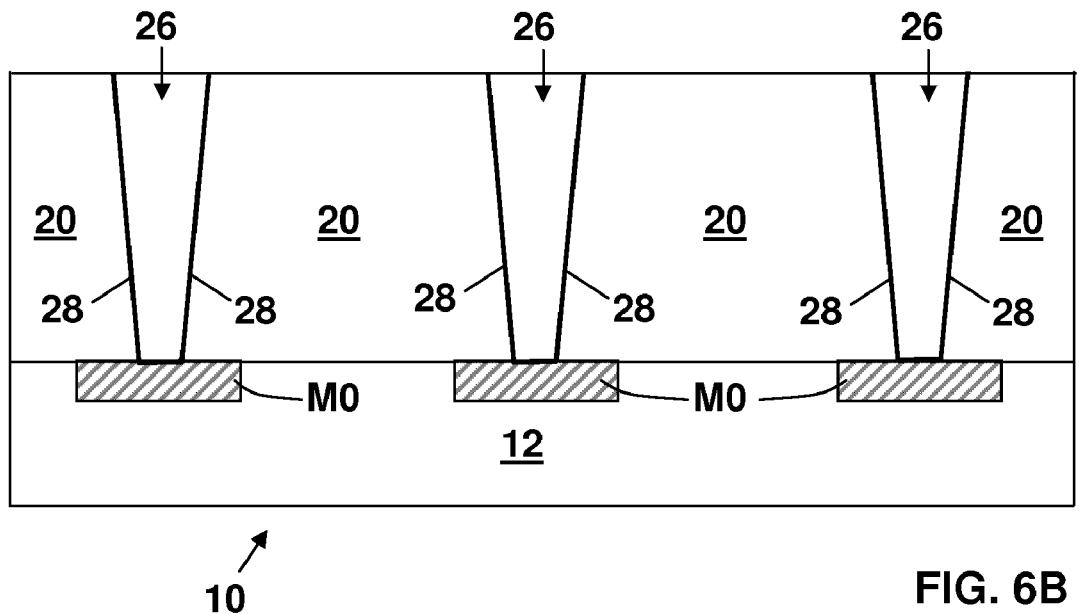
Figure 7:
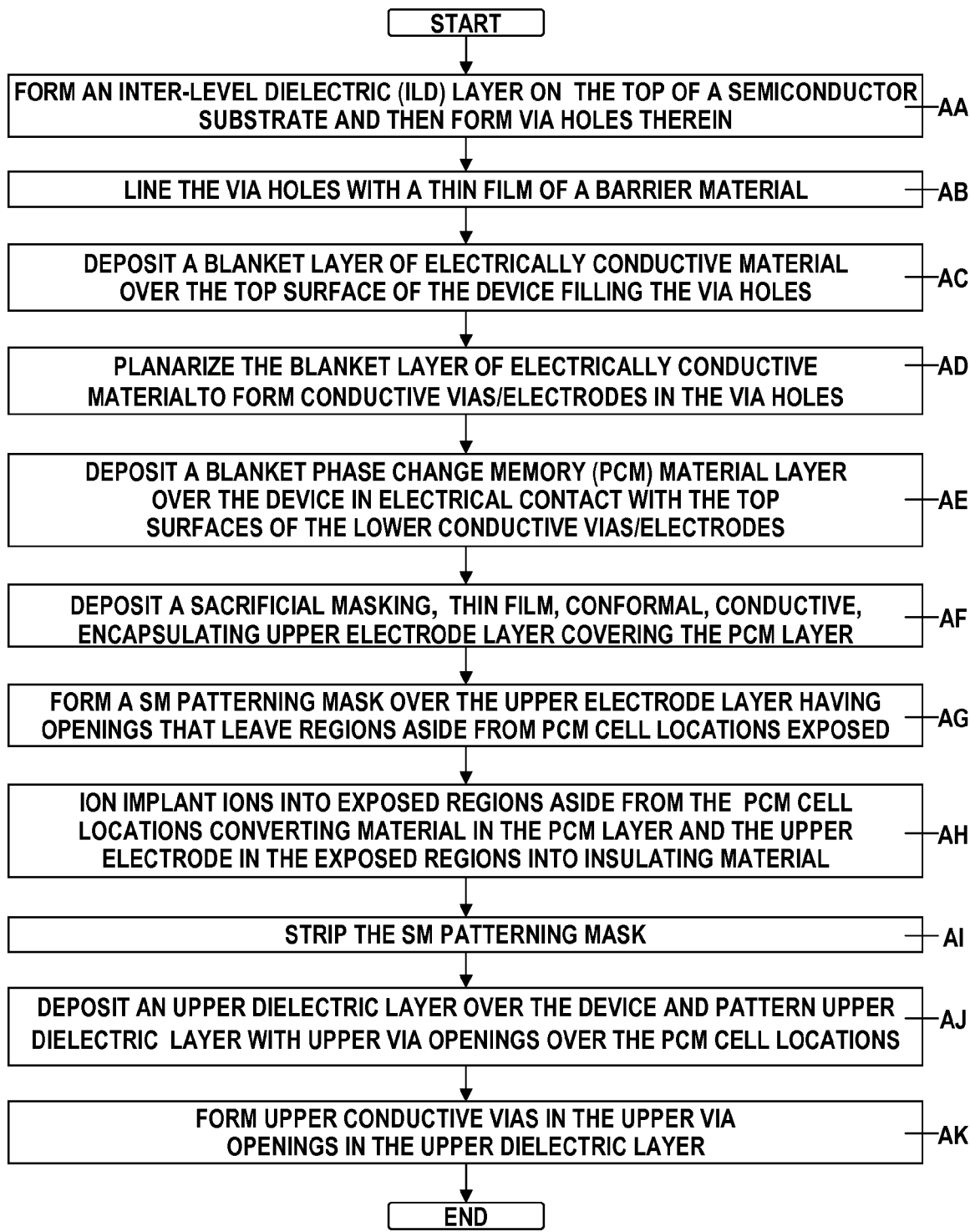
FIG. 7 is a flowchart of the steps performed as shown by FIGS. 6A-6K.

FIG. 6B is a cross-sectional view of the PCM cell 10 of FIG. 6A after lining the holes including the exposed sidewalls of the lower via holes 26 with a thin film layer 28 of a barrier material such as titanium in accordance with step AB in FIG. 7.

Figure 5A:
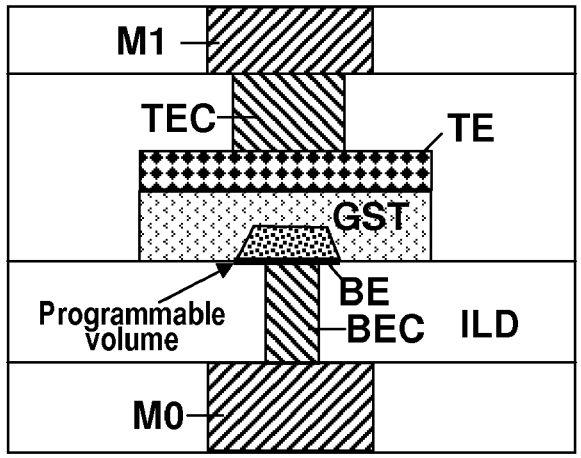
FIGS. 5A and 5B show two alternative prior art PCM cell designs which employ edge contact to reduce switching current.
Figure 5B:
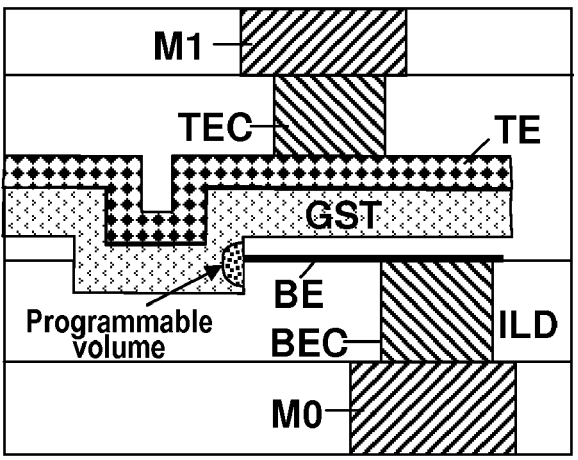
Figure 6C:
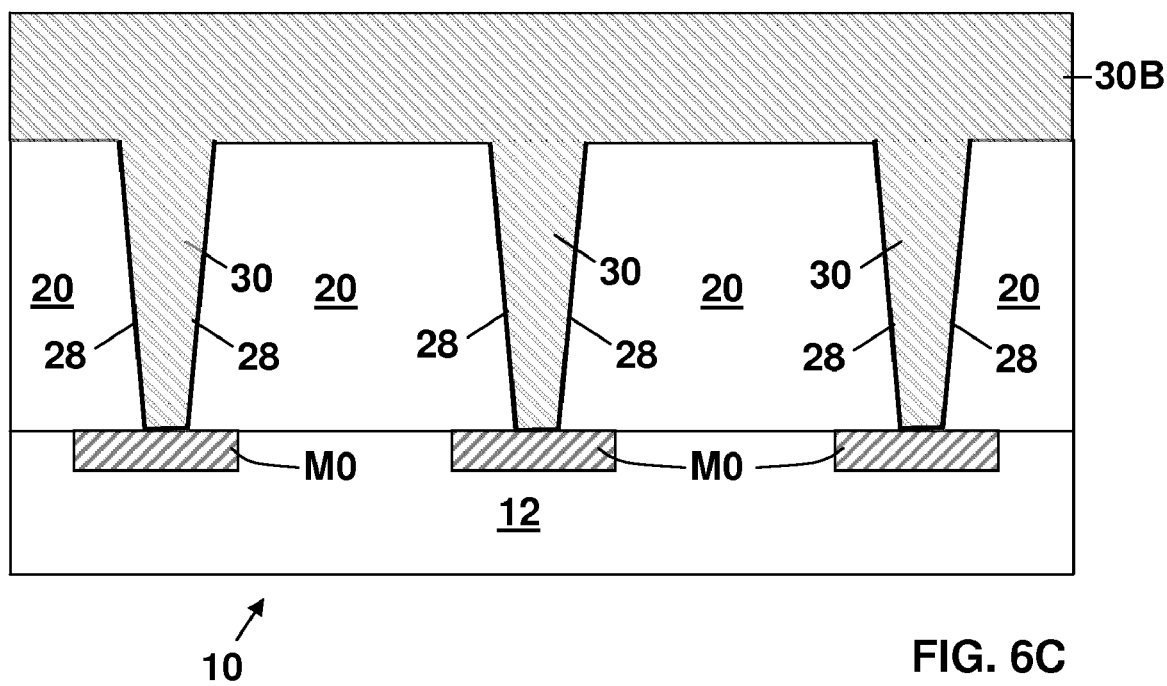

FIG. 6C is a cross-sectional view of the PCM cell 10 of FIG. 6B after performance of step AC in FIG. 7 in which a blanket layer 30B of an electrically conductive material was deposited over the top surface of the device 10 filling the via holes 26 inside the thin film layer 28, thereby forming bottom vias/electrodes 30. The bottom vias/electrodes 30 are provided for a set of three adjacent memory cells of the type shown in FIG. 5A which will be formed in subsequent steps of the process of this invention as illustrated below. The blanket, electrically conductive layer 30B may be composed of tungsten or titanium nitride or a number of other materials and may be comprised of a number of layers (not shown in the drawings for the sake of clarity) and may include additional liner materials, as will be well understood by those skilled in the art.

Figure 6D:
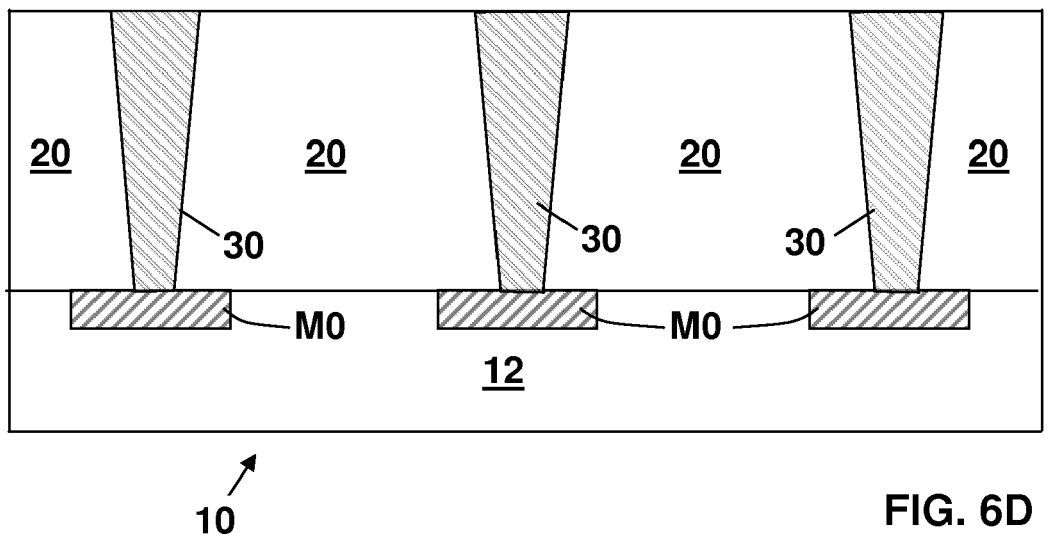

FIG. 6D is a cross-sectional view of the PCM cell 10 of FIG. 6C after performance of step AD in FIG. 7 in which the blanket layer 30B of an electrically conductive material has been planarized to complete formation of the bottom vias/electrodes 30, which comprise a set of electrical conductors. The bottom vias/electrodes 30 are formed on the substrate 12 and are embedded in a Inter-Level Dielectric (ILD) insulator 20 which fills in the space therebetween. FIG. 6D shows a cross-sectional view of a structure which is a partially constructed memory cell of the common "mushroom" style as depicted previously in FIG. 3 and FIG. 5A. The lower vias/electrodes 30 of FIG. 6D typically resemble conductive vias as used elsewhere in conventional CMOS processing and may be formed by lithographic patterning and dry etching processing steps, e.g. Reactive Ion Etching (RIE) or other conventional means.

In summary, referring to FIGS. 6A-6D, the lower vias/electrodes 30 are embedded in the ILD insulator 20 and are patterned by a damascene process which includes forming via holes by anisotropic RIE etching with a photoresist mask, depositing a liner, forming a metal conductor layer, and Chemical-Mechanical Planarization (CMP) planarization, or RIE etchback, as is known to those skilled in the art, on substrate 12 for the first embodiment of the inventive structure. Starting substrate 12 may include underlayer structures of conventional microelectronic devices and multilevel interconnect structures.

The dimensions of the bottom electrode in memory cells of this design are chosen to ensure high current density in the region where the electrode meets the subsequently deposited PCM material. This current density is necessary to ensure that the temperature of the PCM material reaches the levels necessary for switching, as described previously and illustrated in FIG. 2.

Figure 6E:
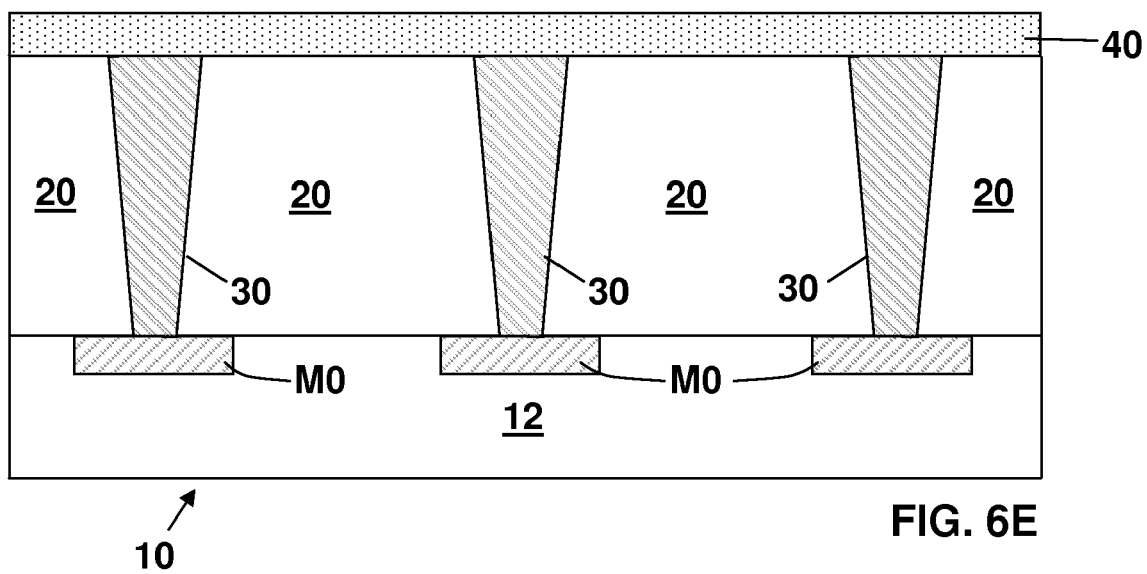
Figure 6F:
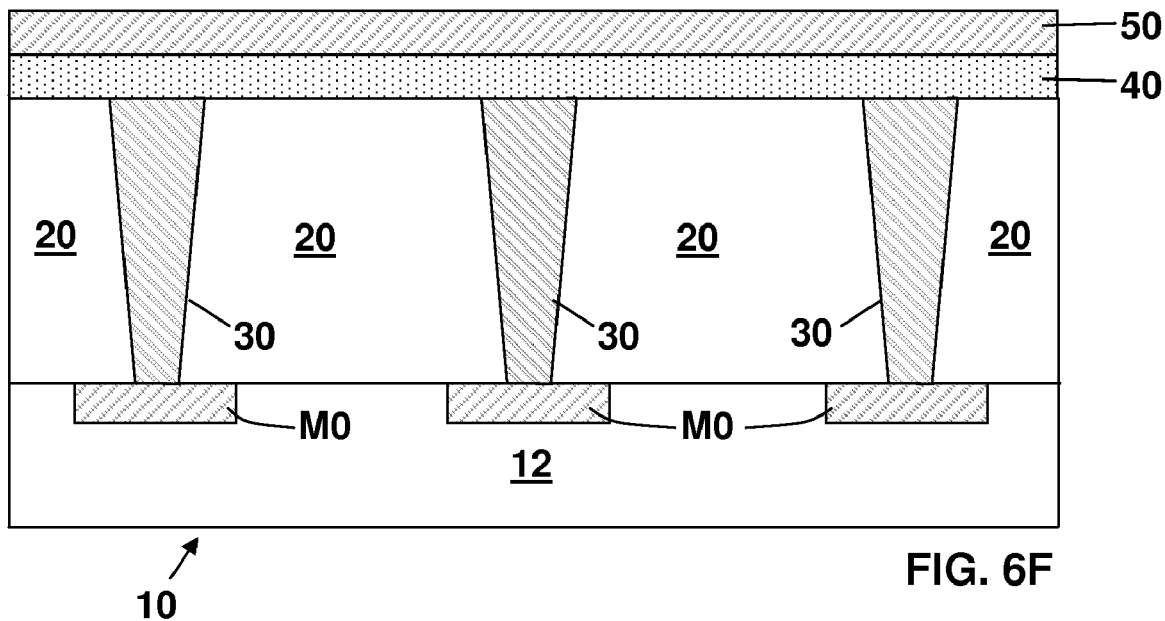

Referring to FIGS. 6E-6F, the risk of chemical damage to the PCM material 40 is eliminated by protecting the PCM material 40 with an encapsulating layer 50 and also by providing an upper conductor layer 60, after deposition and retaining that protective, encapsulating layer 50 throughout subsequent processing.

FIG. 6E is a cross-sectional view of the shows the PCM cell of FIG. 6D after performance of step AE in FIG. 7 of depositing a blanket, continuous, planar film composed of a PCM material layer 40 over the exposed top surfaces of the device 10. The PCM material layer 40 contacts the exposed top surfaces of the bottom vias/electrodes 30 that were formed in the lower via holes 26 providing electrical contact with the top surfaces of the lower electrically conductive vias M0. The PCM material layer 40 is typically deposited by physical deposition or CVD, although other suitable deposition or growth techniques may be used without altering the applicability of the invention described herein. In general, the properties of the PCM layer 40 are dictated by device performance requirements and other constraints.

As employed herein, "physical deposition" refers to use of mechanical or thermodynamic means to produce a thin film of solid material. Since most engineering materials are held together by relatively high energies, and chemical reactions are not used to store these energies, commercial physical deposition systems tend to require a low-pressure vapor environment to function properly. Most can be classified as Physical Vapor Deposition (PVD.) Examples of PVD are thermal evaporation, electrical resistance heating, molecular beam epitaxy, thermal and electron beam evaporation, heating in general with a high-energy beam, e.g. from an electron gun and sputtering, pulsed laser deposition, and cathodic arc deposition (Arc-PVD.)

FIG. 6F is a cross-sectional view of the PCM cell 10 of FIG. 6E after performance of step AF in FIG. 7 of depositing a conductive, planar, thin film, upper electrode, encapsulating layer 50 covering the PCM material upper electrode layer 40. The conductive encapsulating layer 50 (upper electrode layer) is also typically deposited by physical deposition or CVD, although other suitable deposition or growth techniques may be used without altering the applicability of the invention described herein. This invention requires the conductive encapsulating layer 50 to have appropriate thickness, density, hardness, porosity, thermal stability, etc. to protect the PCM material layer 40 throughout processing and also to be of a composition which permits modification of the resistivity of the encapsulating layer 50 as described further below. In general, metallic and semiconducting materials, e.g. titanium (Ti,) titanium nitride (TiN,) silicon (Si,) and the like, are appropriate to be used as the encapsulating, layer 50. The PCM material upper electrode layer 40 and the conductive encapsulating layer 50 form a horizontally extending planar region on the surface of the substrate 12. The PCM material layer 40 and the upper electrode, encapsulating layer 50 comprise a bilayer.

Figure 6G:
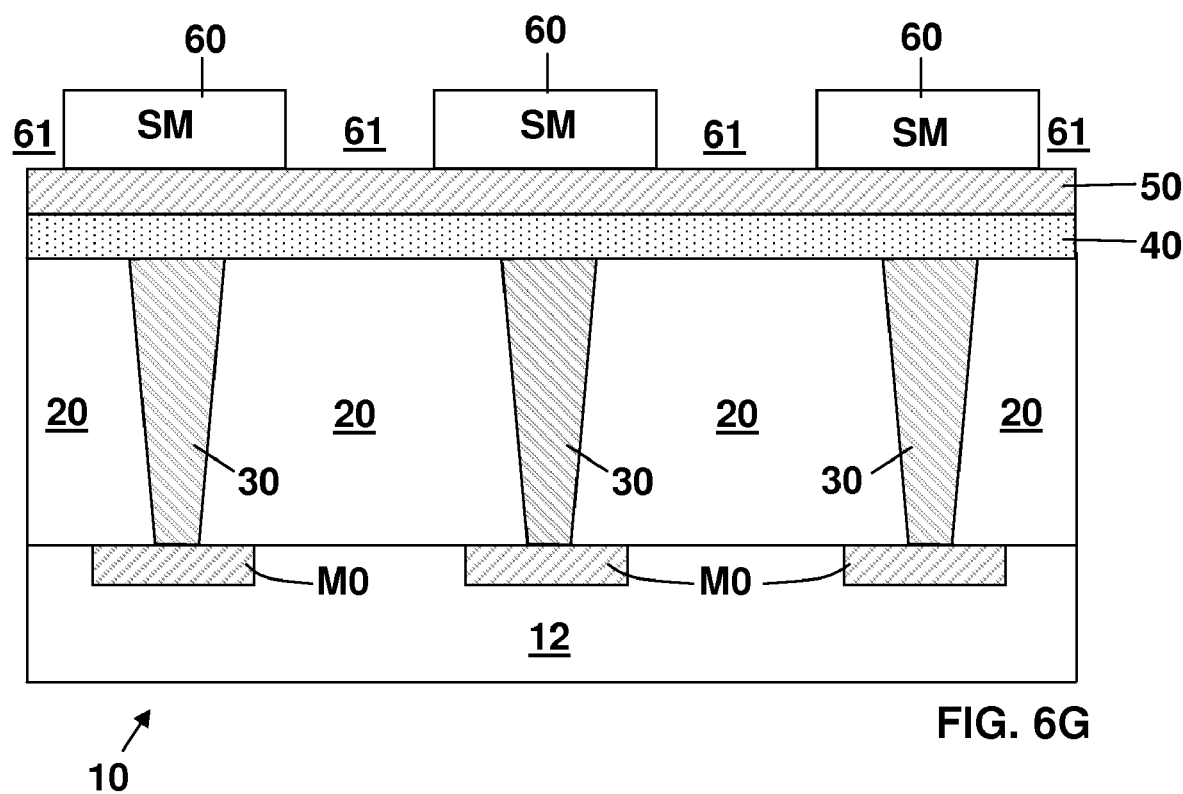

FIG. 6G is a cross-sectional view of the PCM cell 10 of FIG. 6F after performance of step AF in FIG. 7 of covering the upper electrode layer 40 with a Sacrificial Masking (SM) thin film, conformal layer 60 with openings 61 therethrough leaving exposed regions aside from desired PCM memory cell locations, which is to be employed to confine the subsequent film resistivity adjustment to desired regions of the PCM layer 40 and the encapsulating layer 50. The simplest conventional practice within the industry is to form the SM layer 60 from an organic photoresist material patterned by photolithography. However, the SM layer 60 may comprise several different kinds of materials such as dielectrics, metals, non-photoactive organics, etc., and may be formed by alternate methods such as imprint lithography, micromachining, self-assembly, etc. without detracting from the applicability or novelty of the invention described herein.

Figure 6H:
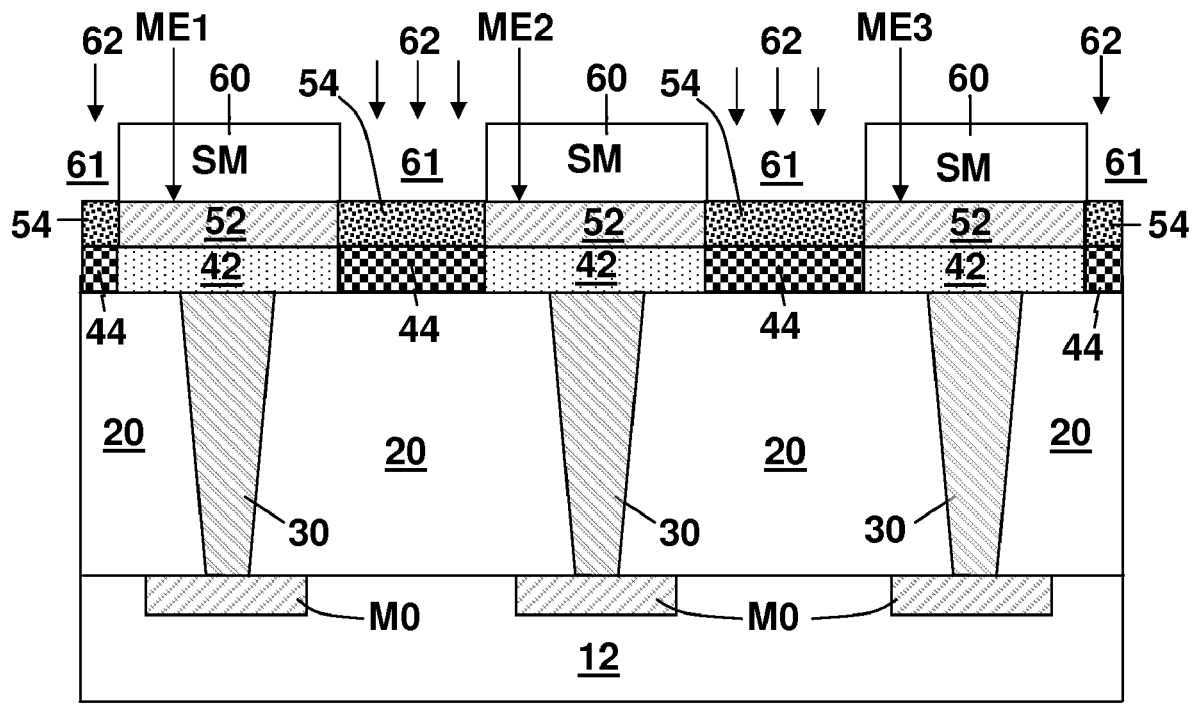

FIG. 6H is a cross-sectional view of the PCM cell 10 of FIG. 6G following step AH in FIG. 7 of implanting ions into exposed regions of PCM cell 10 thereby converting exposed regions of the bilayer comprising the PCM layer 40 and the encapsulating layer 50 into modified regions of insulating material by modifying the resistivity thereof. The modification of the resistivity of the bilayer comprising the PCM layer 40 and the encapsulating layer 50 is accomplished by performing a step of ion implantation of ions 62 through openings 61 into exposed, outboard regions aside from the desired locations of PCM cells. The implanted ions 62 convert material in the bilayer of PCM material layer 40 and the encapsulating layer 50 (upper electrode layer) in the exposed, outboard regions into insulating materials, i.e. high electrical resistance, modified regions of the bilayer aside from the mask SM. That is to say that the exposed resistive, encapsulating regions 54 which were formerly portions of the conductive encapsulating layer 50 and the highly electrically resistive PCM regions 44 which were formerly portions of the of the PCM material layer 40 are now nonconductive or weakly conducting, modified regions, i.e. converted to a substantially or completely nonconductive state in accordance with a first embodiment of this invention. Aside from the openings 61, PCM cells ME1, ME2 and ME3 have been created where there are regions of active PCM material 42 which remain as unmodified regions of the PCM material layer 40 and a set of conductive regions of top electrical conductors 52 which remain as unmodified regions of the conductive, encapsulating layer 50 respectively interspersed between the resistive, modified encapsulating regions 54 and the highly electrically resistive, modified PCM regions 44.

The structure now includes the three PCM cells ME1, ME2 and ME3 comprising active PCM material 42 that are unmodified regions of the PCM material layer 40 and a set of top electrical conductors 52 formed on the top surfaces of the regions of active PCM material 42, that are unmodified regions of the encapsulating layer 50 respectively interspersed between the, modified resistive, encapsulating regions 54 and the highly electrically resistive, modified PCM regions 44 which have been ion implanted and annealed.

The preferred method for modifying the film resistivity is to utilize ion implantation and associated processes to adjust the film composition of the outboard regions. In a specific but not limiting example, implantation of high doses of oxygen atoms into a metallic or semiconducting encapsulating film will transform the layer in an outboard region into an insulating material, as in the popular SIMOX (Separation by IMplantation of OXygen) process. In the SIMOX process a buried high dose of oxygen which was implanted into a silicon wafer is then converted to silicon oxide by a high temperature annealing. The SIMOX method is employed for manufacturing Silicon-On-Insulator (SOI) structures on a silicon wafer. Similarly, the addition of appropriate species to the PCM material can inhibit its ability to enter the conductive polycrystalline phase described previously.

A key difference between the process of this invention and the SIMOX process is that the implanted ions are to stack up in a region near the surface, whereas in the SIMOX process the ions pass completely through the top layer (which will become active silicon) and deposit in a band below that region. Accordingly, with this invention, the implantation energy is lower than for SIMOX and in fact, the energy may be so low that a process such as plasma immersion may be employed, which is compatible with the trend towards shallower junctions employed to form shallow implants. Enough ions are needed throughout the bilayer to modify its resistivity throughout the treated regions of the bilayer although modification does not have to be uniform, so long as the modified film has a sufficiently high resistivity everywhere. Depositing ions in a band can be employed and there will be some natural spreading of the implanted species by diffusion and annealing. Alternatively, multiple implantations at different energies can be employed to disperse the ions. The implantation needs to be as deep as the modified films are thick. Some penetration into the dielectric below the PCM film can be tolerated, as long as the implanted species does not detrimentally affect performance of the dielectric.

Electrical isolation of adjacent regions of active PCM material 42 is accomplished by converting intermediate regions of the PCM material 40 into a set of highly electrically resistive regions 44 to produce high resistance between the regions of active PCM material 42 including the resistive, encapsulating regions 54 of the encapsulating layer 50. The preferred method for modifying resistance is implantation of ions such as oxygen, nitrogen, carbon and the like to convert the films of the outboard regions into insulators, but other approaches are possible. The ions implanted need to be selected to assure that the compounds which are produced during annealing have sufficient resistance, as will be well understood by those skilled in the art. The preferred species for implantation will depend upon the specific choice of initially-conductive encapsulating layer.

After the local resistivity modification just described, the wafer surface will contain regions of two types. The first type of outboard region 44/54 is one wherein both the encapsulating film 50 and PCM material 40 have been rendered nonconductive or very weakly conductive as is the case with non-conductive or weakly conducting outboard PCM regions 44 in FIGS. 6H and 6I. The second type of region is an inboard region where the encapsulating film 52 remains conductive and the active PCM Material 42 remains switchable between the high and low resistivity states necessary for information storage (unmodified electrode formed by the encapsulating film 52 and Phase Change Material 42 in FIGS. 6H and 6I). In general, the films should be left unaltered in the inboard regions comprising the active memory cells. The structure now includes the three PCM cells ME1, ME2 and ME3 comprising active PCM material 42 which are unmodified regions of the PCM material layer 40 and a set of top electrical conductors formed from the encapsulating film 52 on the top surface of the active PCM material 42, which are unmodified regions of the encapsulating layer 50 respectively interspersed between the resistive encapsulating regions 54 and the resistive PCM regions 44.

Figure 6I:
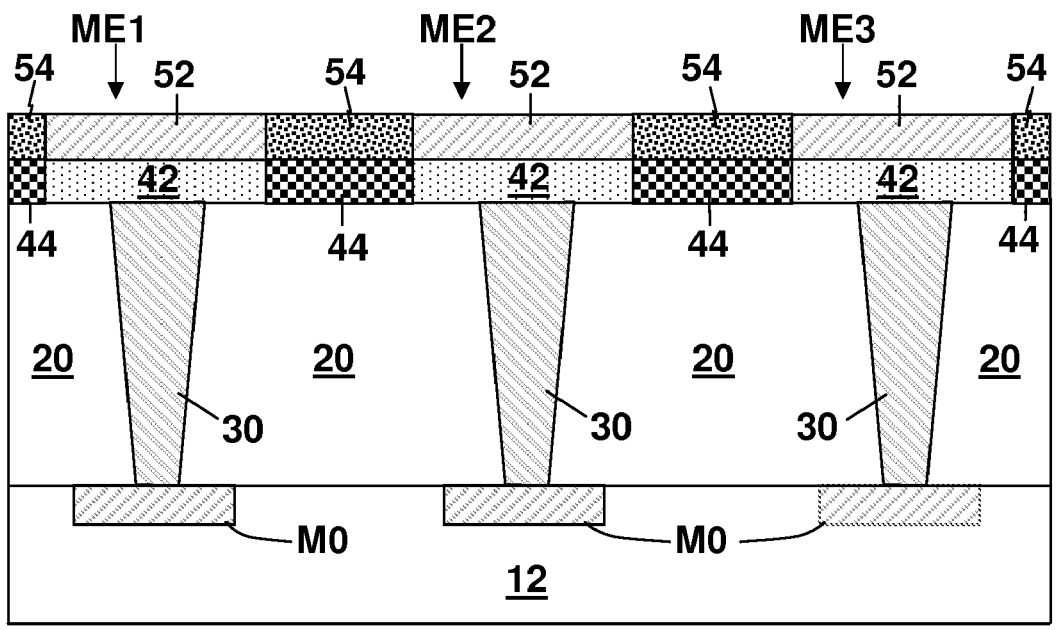

FIG. 6I shows the PCM cell 10 of FIG. 6H after performing step AI in FIG. 7 of stripping (removal) of the patterning/masking SM layer 60 leaving the top surfaces of the electrical conductors formed from the encapsulating film 52 of the three newly created PCM cells ME1, ME2 and ME3 exposed.

Figure 6J:
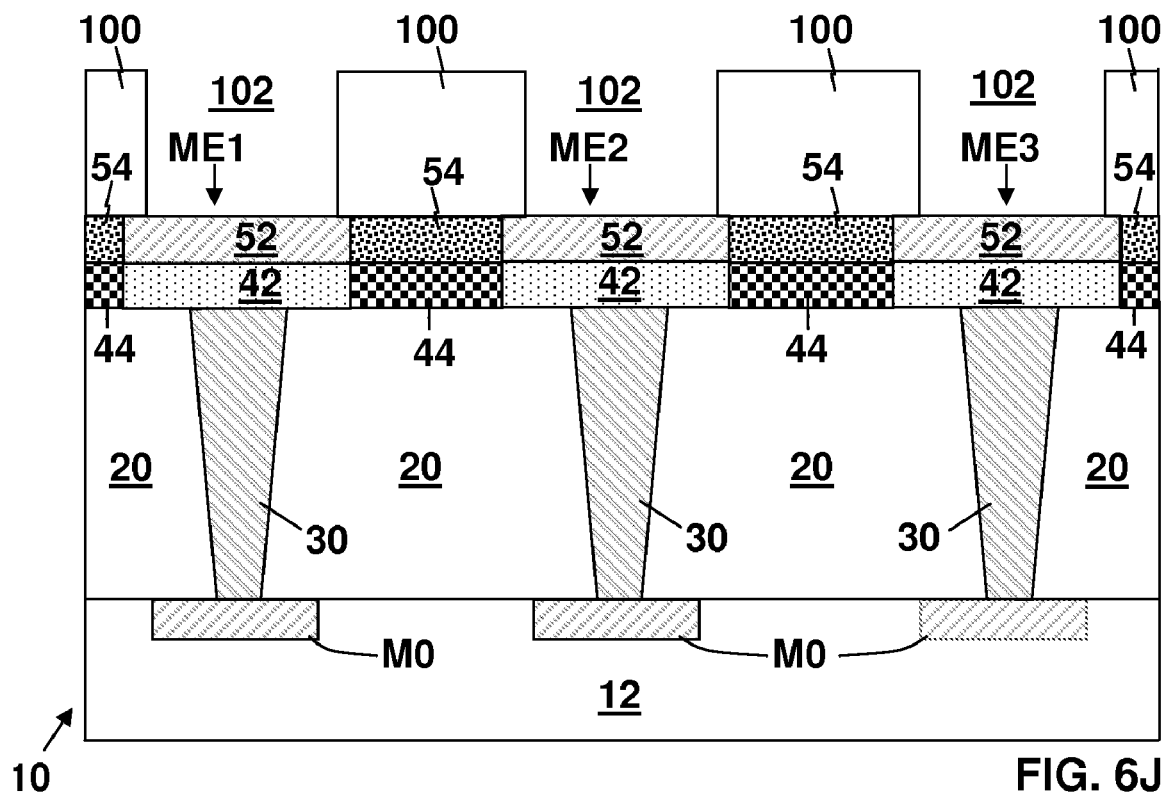

FIG. 6J shows the PCM cell 10 of FIG. 6I after performance of step AJ in FIG. 7 in which an upper dielectric layer 100 has been deposited over the device 10 and the upper dielectric layer 100 has been patterned with upper via openings 102 therethrough located so as to re-expose the top surfaces of at least portions of the PCM cells ME1, ME2 and ME3, preferably leaving most of the top surfaces of the three top electrical conductors formed from the encapsulating film 52 exposed. Initially a blanket layer of dielectric material 100 was formed in preparation for formation of the set of openings 102 therethrough for upper vias 90 shown in FIG. 6K. The dielectric layer 100 may comprise the same material as the previously-formed dielectric layer 20 or it may be of another material as dictated by device performance, manufacturability concerns, or other constraints.

Figure 6K:
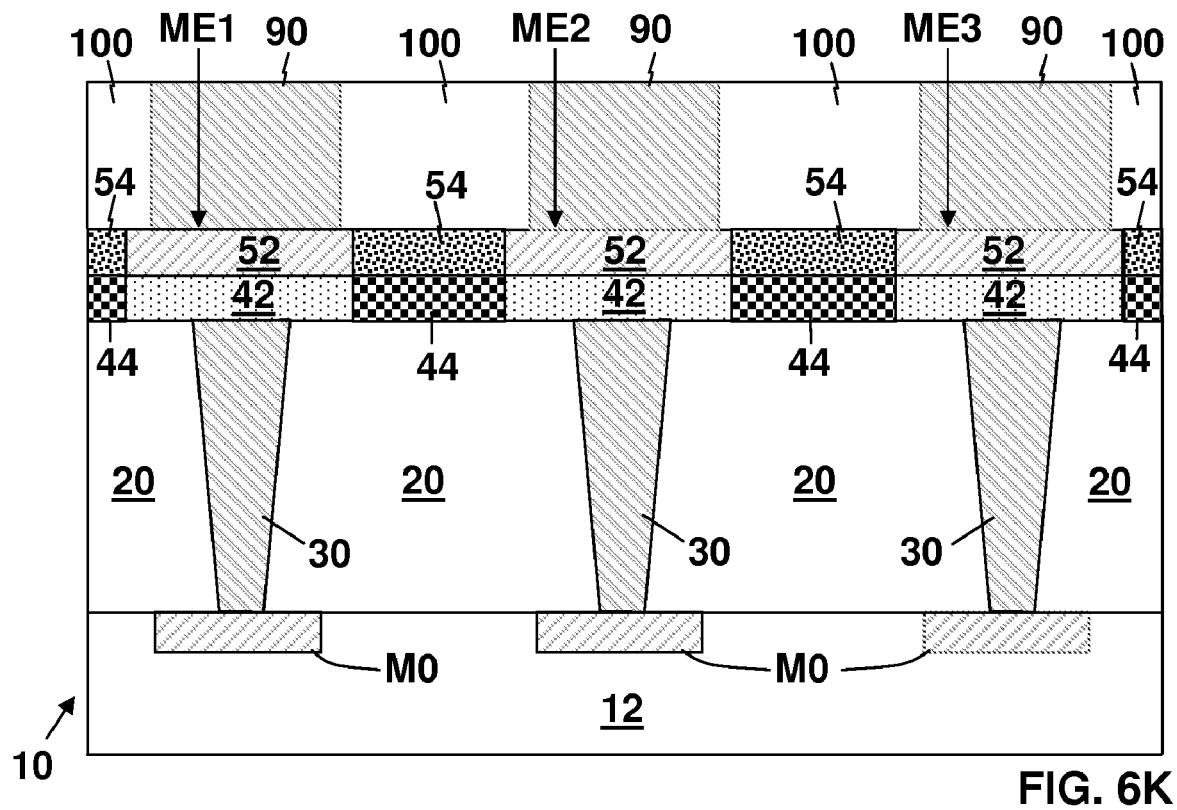

FIG. 6K shows the PCM cell 10 of FIG. 6J after performance of step AK in FIG. 7 wherein upper, electrically conductive vias 90 are formed in the upper via openings 102 in the upper dielectric layer 100 in electrical and mechanical contact with the top surfaces of the top electrical conductors formed from the encapsulating film 52 of the PCM cells ME1, ME2 and ME3. The upper conductive vias 90 are adapted for providing contact to the top electrical conductors formed from the encapsulating film 52 and therethrough to the active PCM material 42 for electrical connections to wiring which may be formed subsequently, as will be well understood by those skilled in the art. The upper conductive vias 90 have been formed in the layer of dielectric material 100 by conventional means. The conductive vias 90 may be similar in composition and construction to the lower vias 30 shown previously in FIG. 6D, or they may be composed of different materials or the may be fabricated differently.

It should be noted that, while the description above has referred to an encapsulating layer that is initially conductive and then selectively converted to an insulating state, one skilled in the art may also envision the use of materials which are initially formed in an insulating state and then rendered conductive in the regions of the active memory cells. In a specific but not limiting example, the encapsulating layer could be formed of undoped polycrystalline silicon and subsequently doped to increase its conductivity in the regions of the active memory elements.

Figure 3:
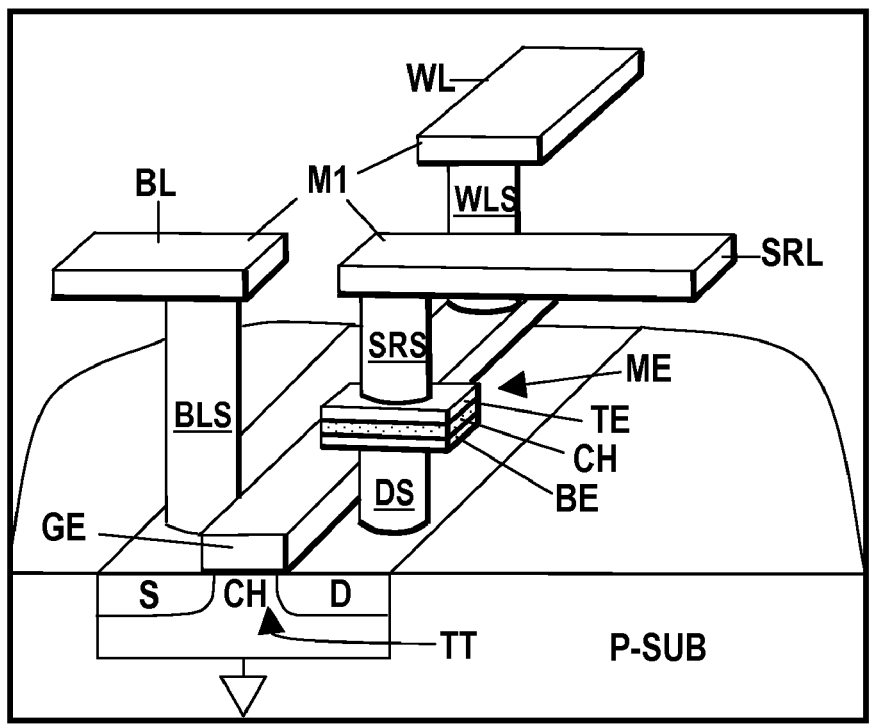
FIG. 3 shows a simplified cell structure of chalcogenide PCM cell comprising a Phase Change Element (PCE) and a conventional MOS transfer transistor.
Figure 4:
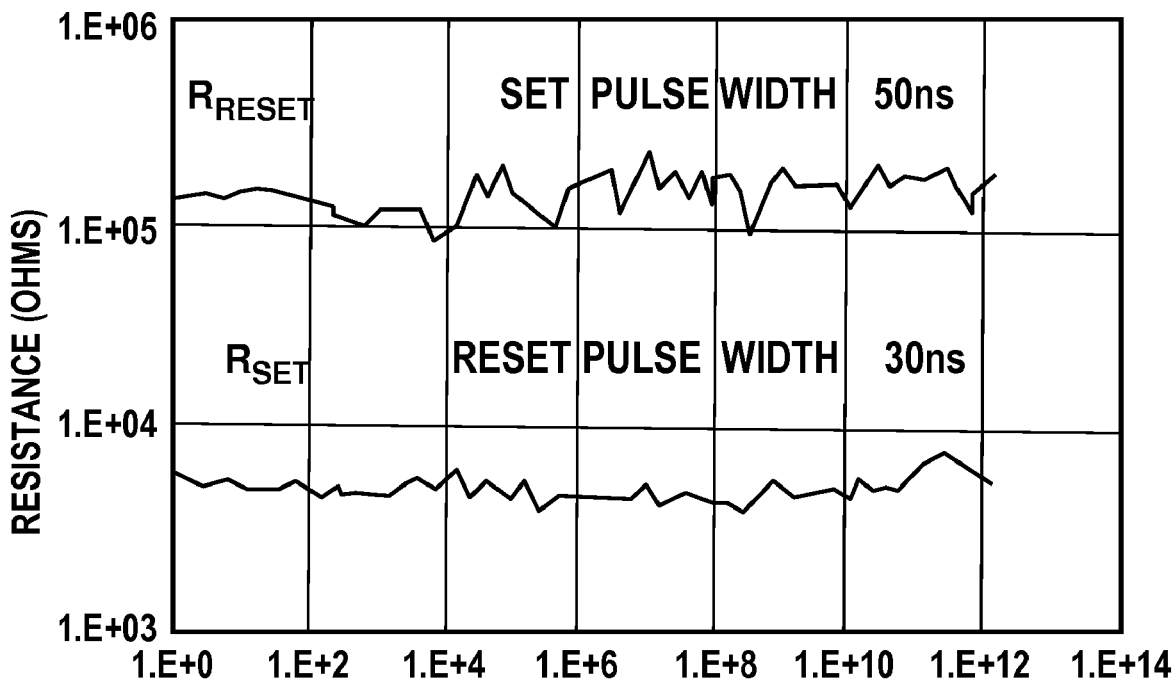
FIG. 4 is a graph of resistance as a function of the number of cycles of operation of a PCM cell for both the SET resistance and RESET resistance which shows the cycling endurance of a chalcogenide PCM cell over many cycles.

The above discussion describes the essence of one embodiment of this invention and its application to formation of arrays of memory elements. However, it is recognized that there are numerous instances wherein it will be desirable or necessary to provide unswitched electrical pathways through the plane containing the memory elements. For example, FIG. 3 shows two direct contacts between the wiring level labeled "M1" and the transistor TT therebelow.

Integrating the current invention into devices using such "pass-through" contacts will require provision for creating uninterrupted electrical pathways through the encapsulating and phase change layers. This may be accomplished in two ways.

Second Embodiment

Figure 8A:
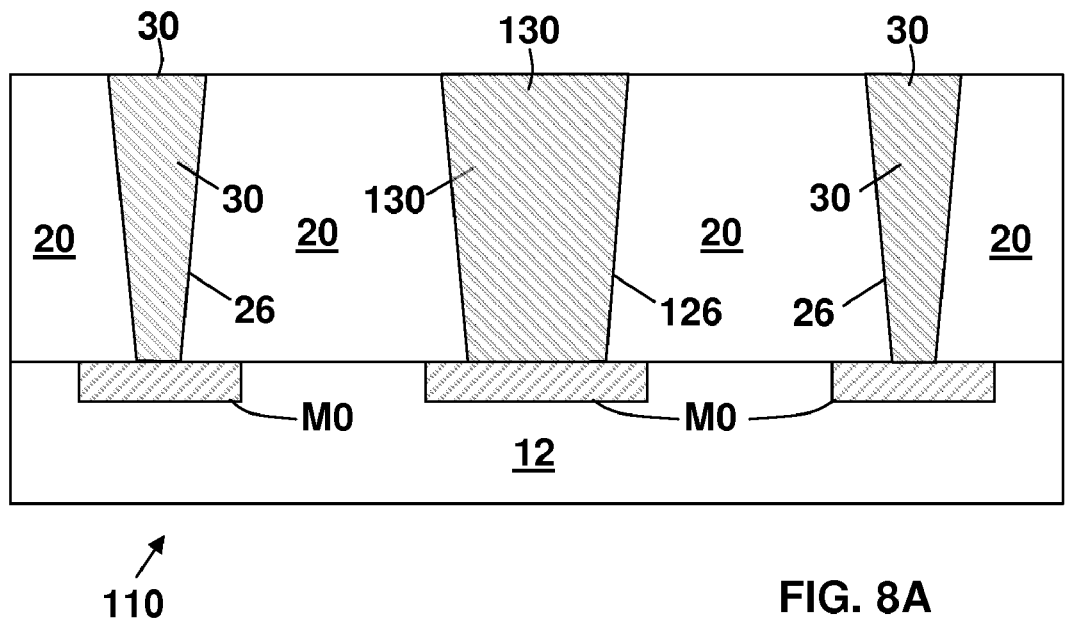
FIGS. 8A-8K illustrate a method of forming a PCM cell including a set of two memory elements and one central via which serves as a pass-through contact.
Figure 8B:
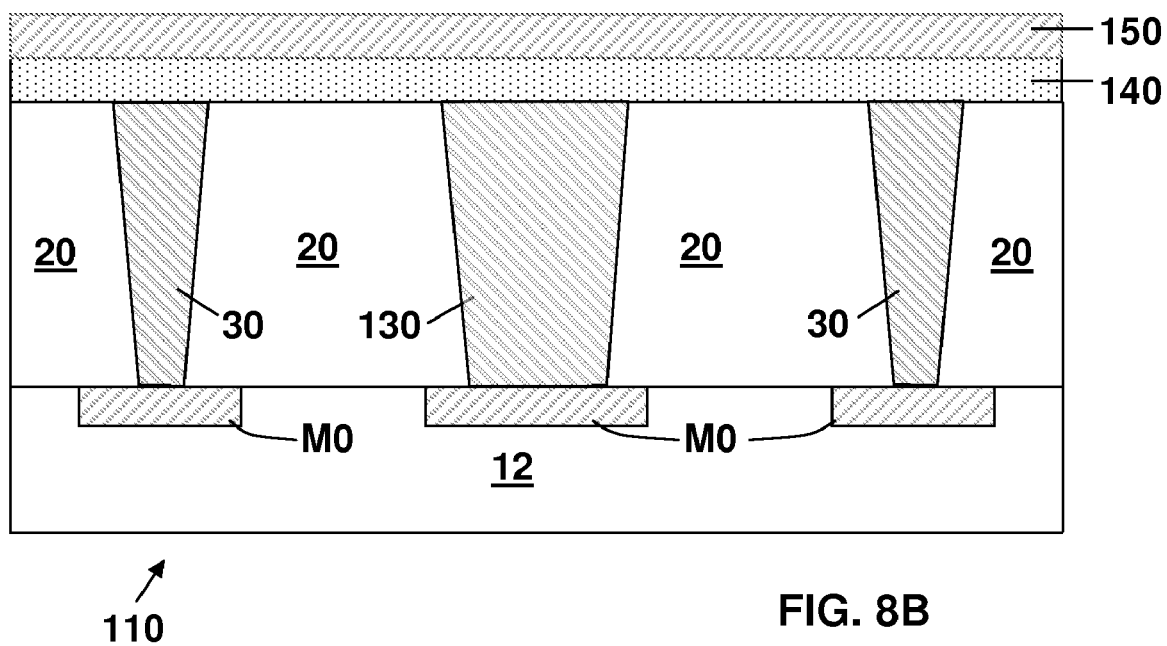
Figure 8C:
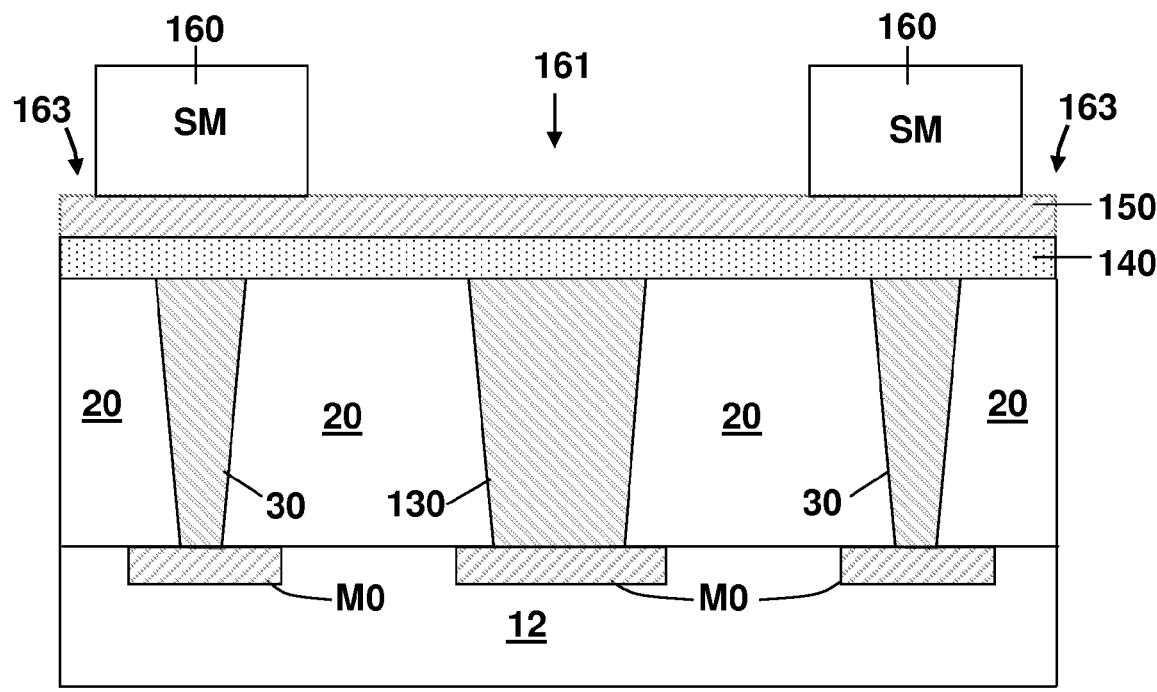
Figure 8D:
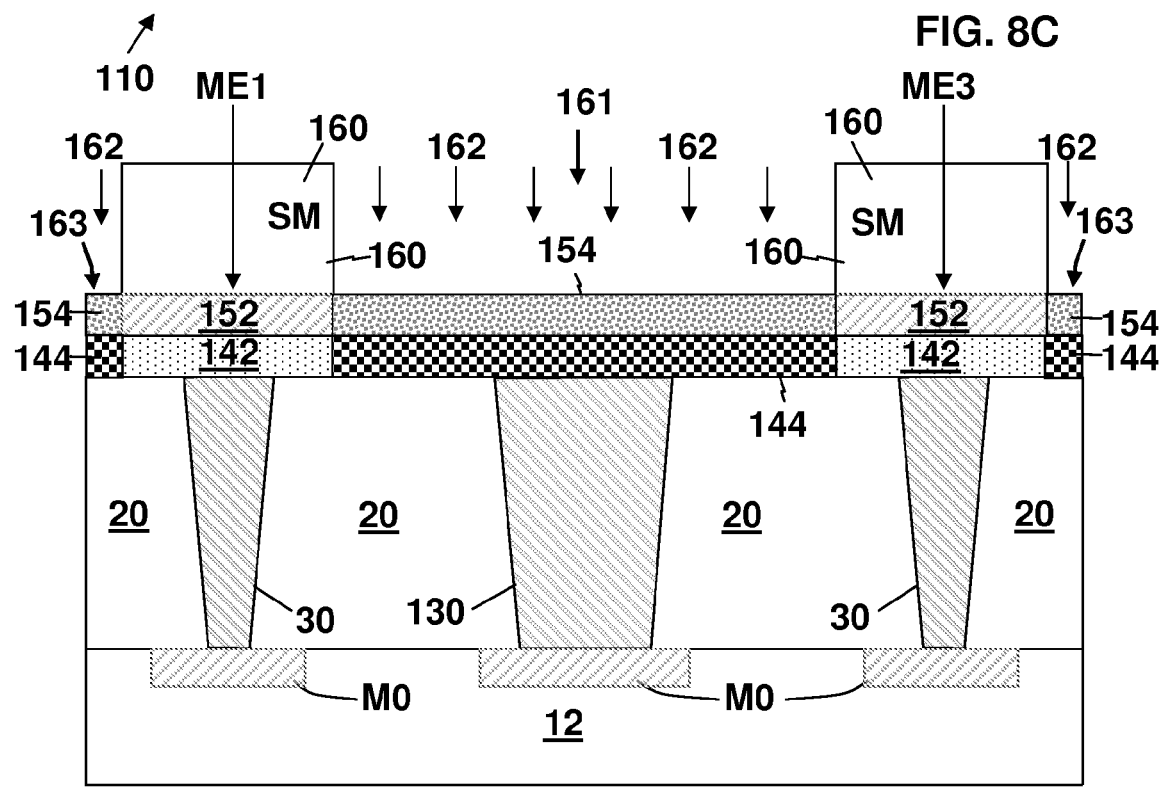
Figure 8E:
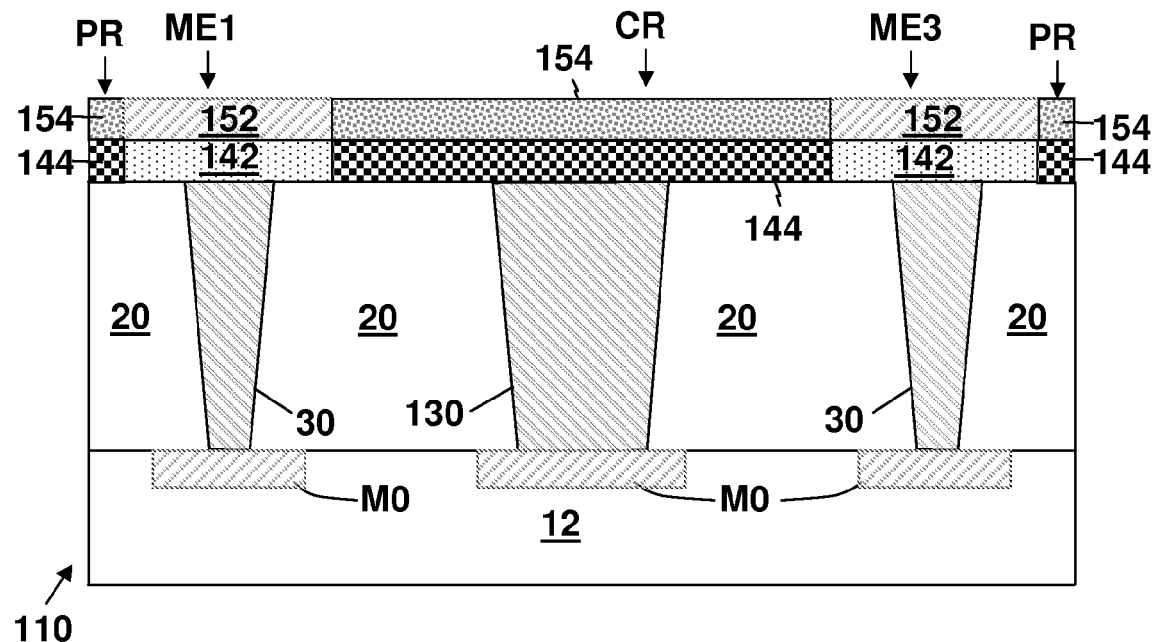
Figure 8F:
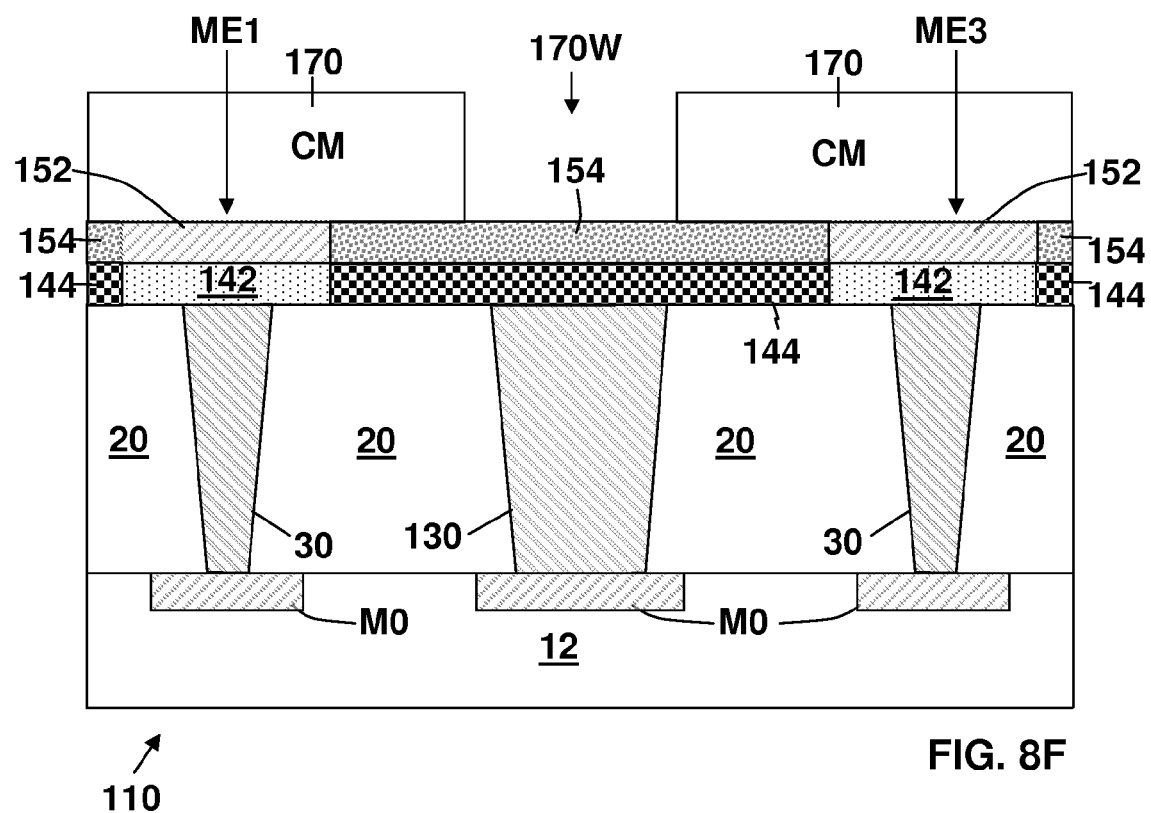
Figure 8G:
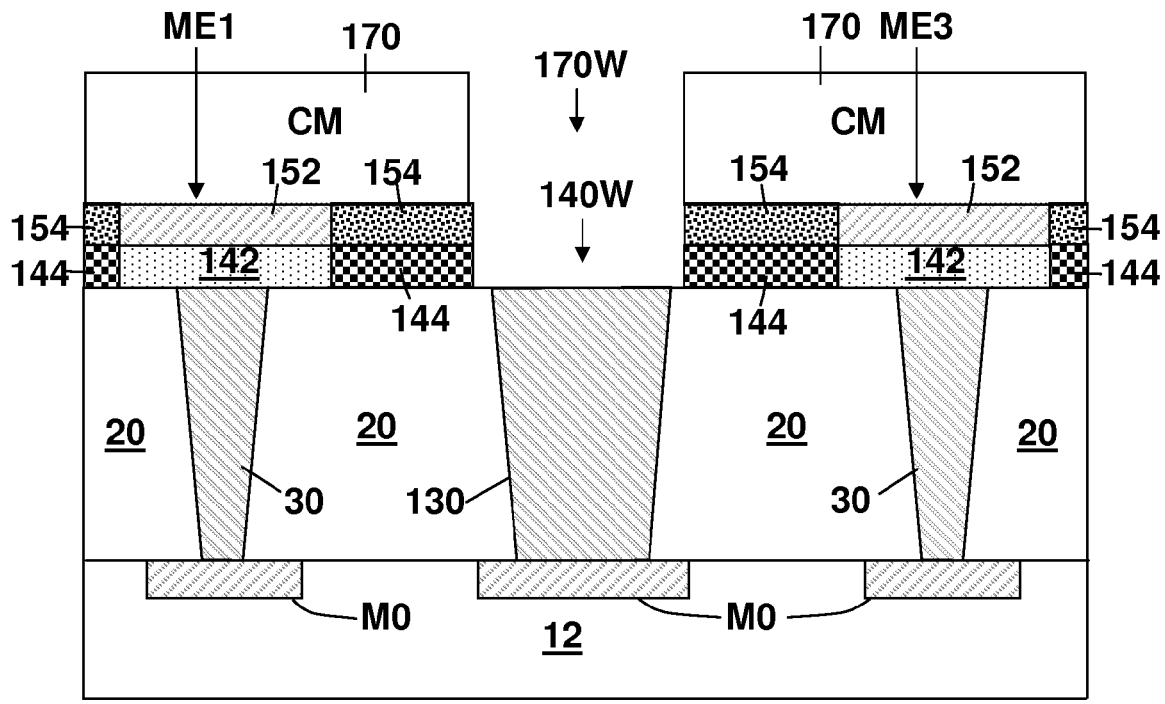
Figure 8H:
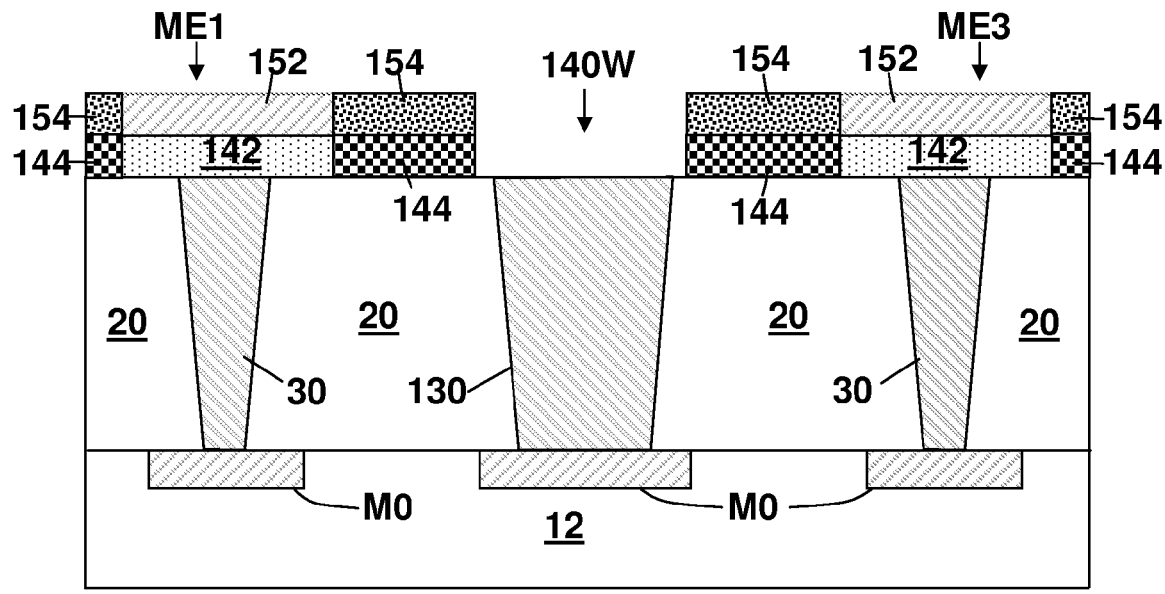
Figure 8I:
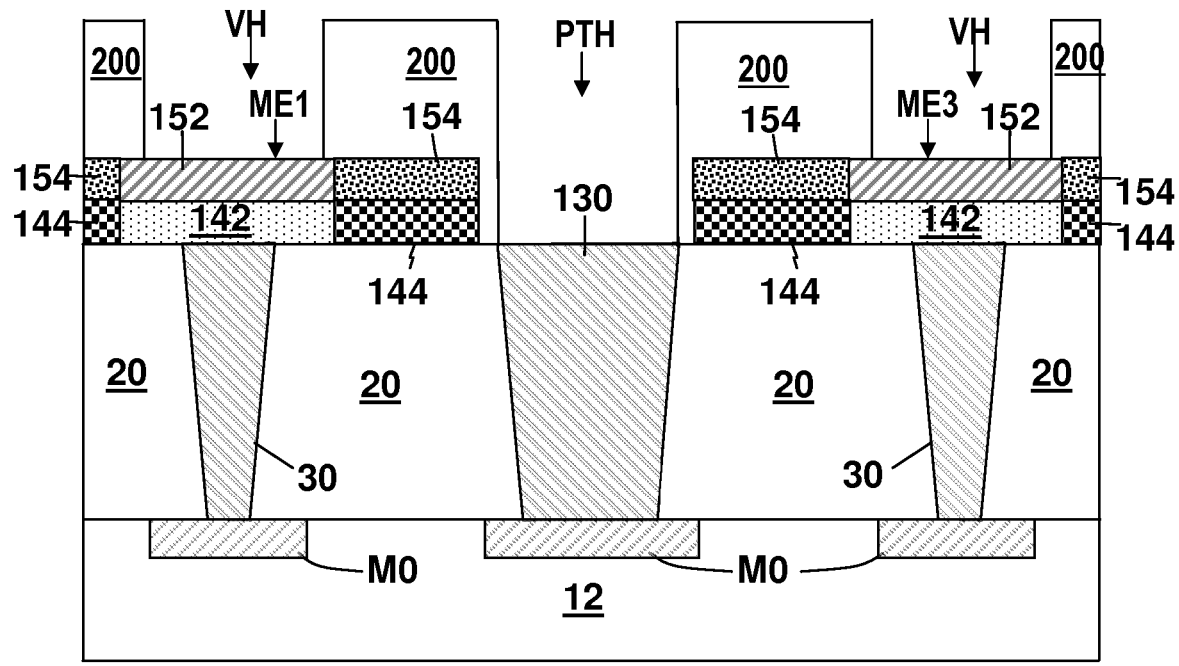
Figure 8J:
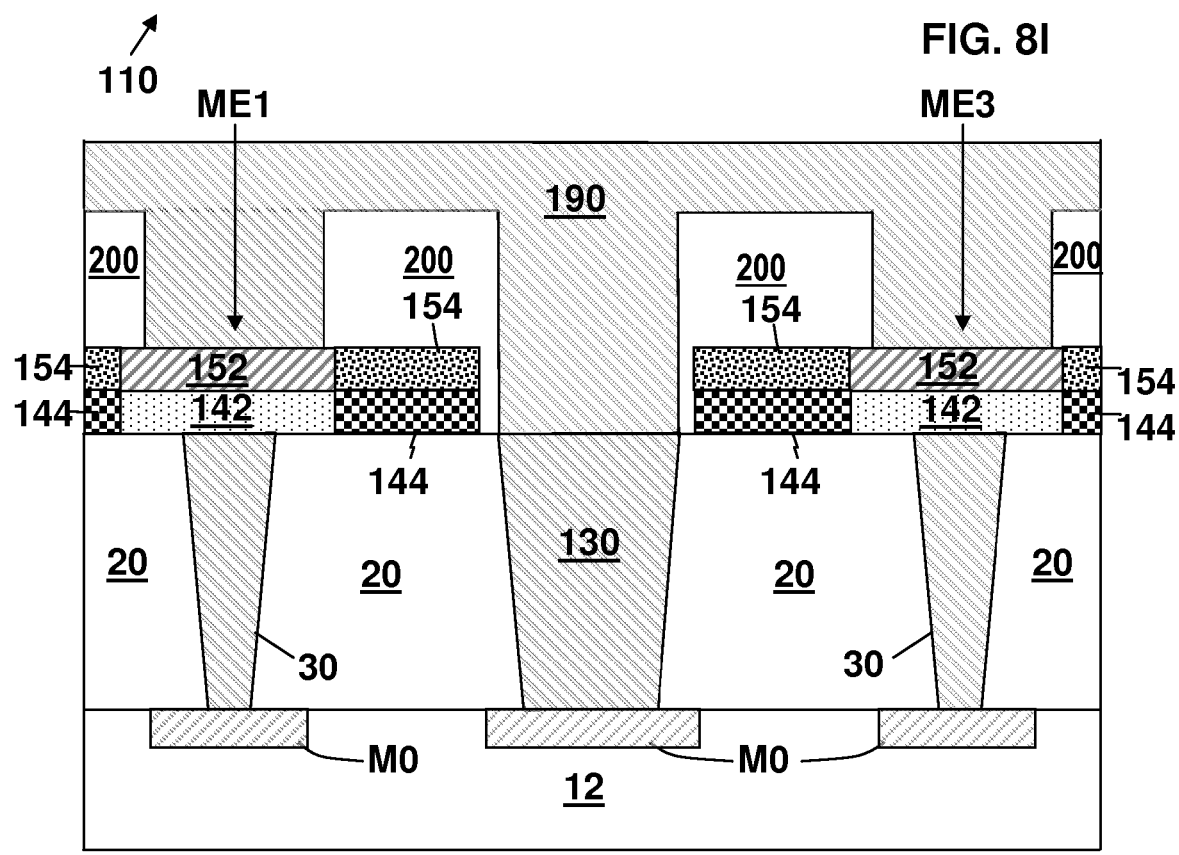
Figure 8K:
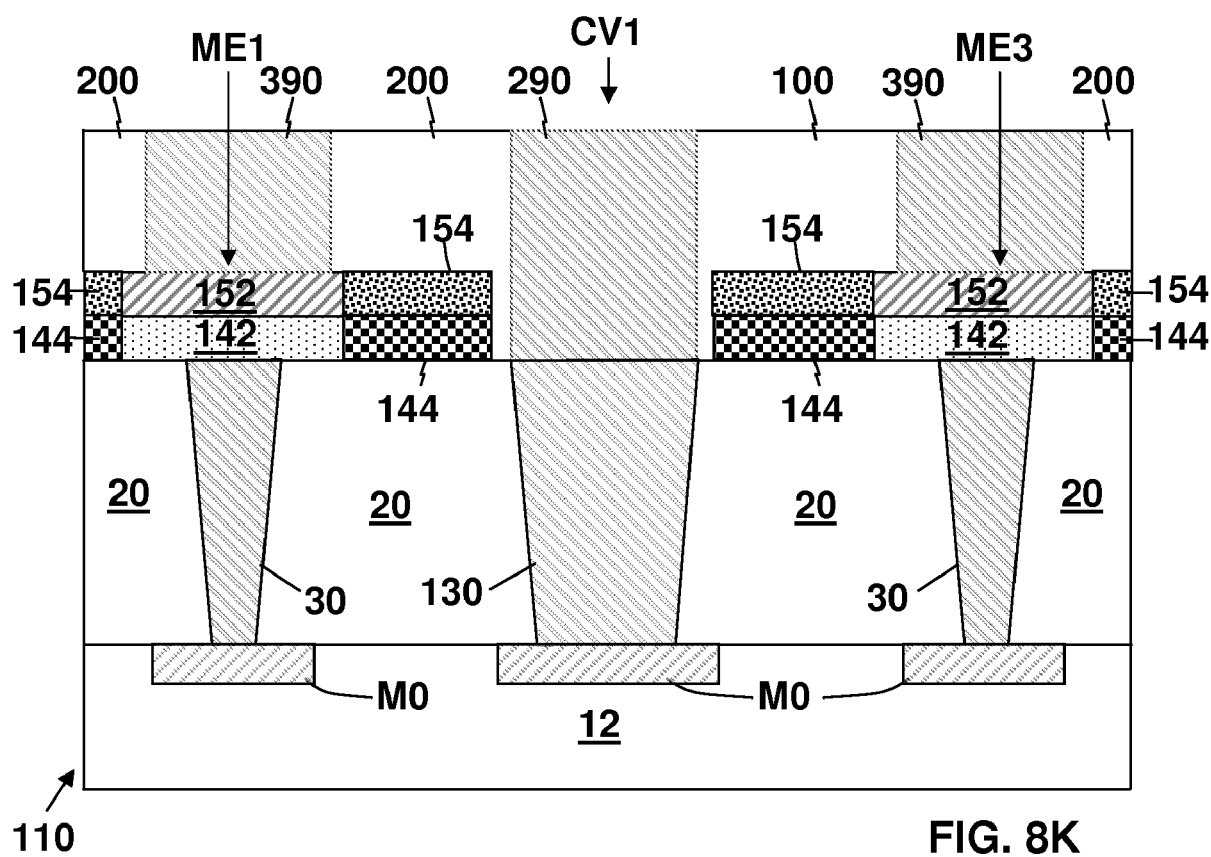

FIGS. 8A-8K illustrate a method of forming a set of two memory elements and one central via (pass-through contact.) FIG. 8J shows a second embodiment of this invention comprising a PCM cell 110 which is an alternate version of the structure of FIG. 6K. This illustrates the integration of the present invention into a device requiring unswitched interconnections in the form of pass-through vias which connect between wiring levels above and below the layer incorporating memory cells. The central via/contact 130 shown in FIG. 8A which is located in the lower center of the PCM cell 110 is the lower portion of the pass-through via CV1. The upper portion 290 of the pass-through via CV1 is shown in FIG. 8K. The pass-through via CV1 provides a connection to the lower wiring level M0, which will not become part of a PCM cell.

Figure 9:
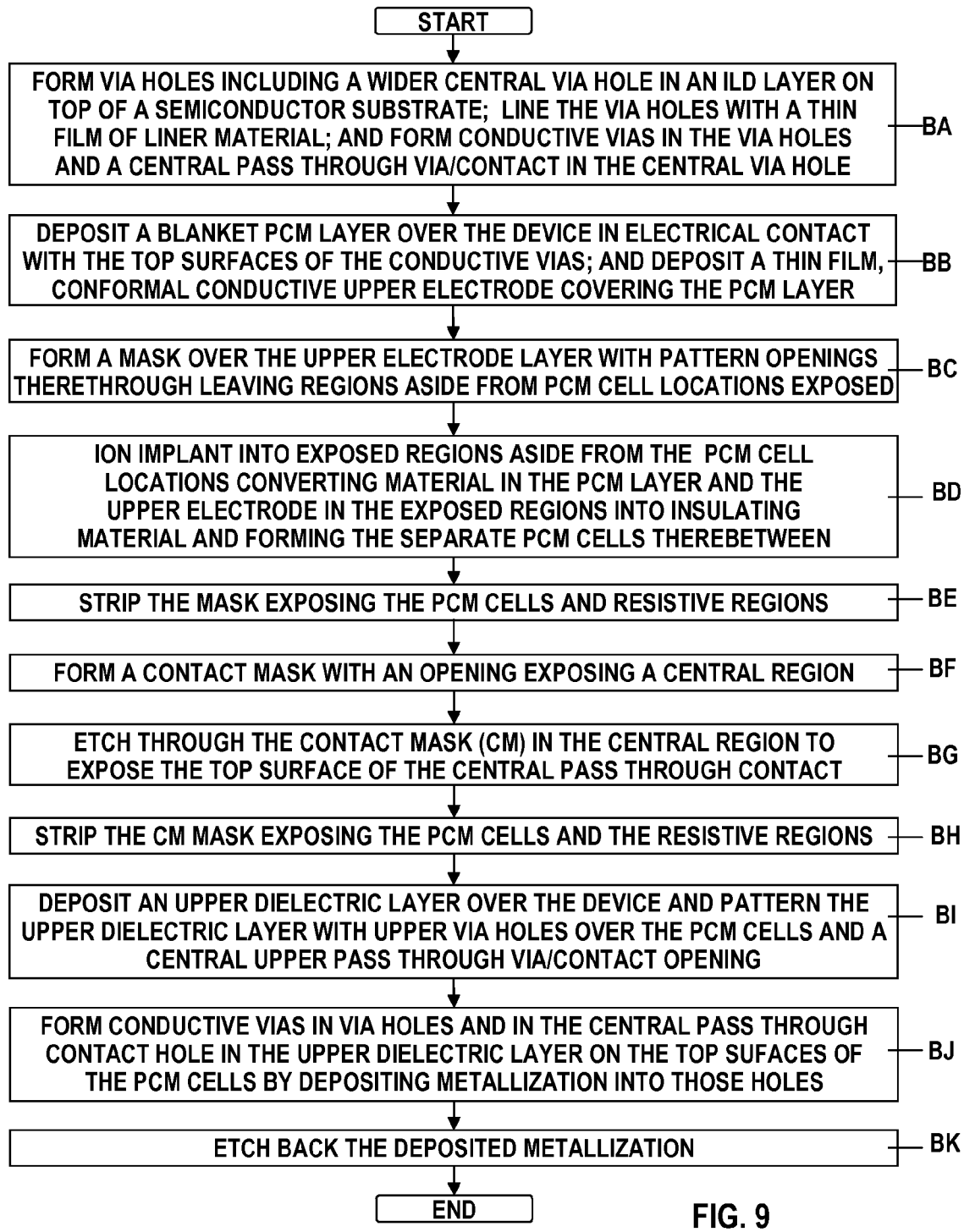
FIG. 9 is a flowchart showing the steps performed as shown by FIGS. 8A-8K.

FIG. 9 is a flowchart showing the steps performed from FIG. 8A to FIG. 8K.

FIG. 8A shows a starting structure in an intermediate stage of manufacture of the PCM cell 110 which has been formed after steps AA through AC in FIG. 7 and after step BA in FIG. 9. In step BA in FIG. 9, a set of only two vias 30 are provided in via holes 26 for connection to PCM cells. However, in this case a centrally located lower, pass-through via/contact 130 has been provided in a wider cross section via hole 126 The two vias 30 along with the centrally located lower, pass-through via/contact 130 comprise a set of electrical conductors. The lower pass-through via/contact 130 replaces the central via 30 shown in FIGS. 6C-6K. The central pass-through via/contact 130 is a component, i.e. the lower portion, of the central pass-through via CV1 of FIG. 8K. It is drawn with a larger cross sectional dimension than the two bottom electrodes 30 in recognition of the fact that bottom electrodes for memory cells of this design are typically fabricated with smaller cross sectional dimensions, i.e. below those typical of interconnects, for the present technology node in order to provide the high current density required for switching the PCM material. However, this illustrative construct should not be construed as constraining the relative dimensions of the electrodes and pass-through contacts; the pass-through contacts may be larger or smaller than the electrodes as dictated by device and process requirements.

Fabrication of an array containing pass-through contacts CV1 of FIG. 8K proceeds in much the manner shown previously for pure memory arrays in FIGS. 6A through 6K.

FIG. 8B shows the PCM cell 110 of FIG. 8A after performance of step BB in FIG. 9 of depositing continuous films of a PCM material upper electrode layer 140 and a continuous conductive encapsulating layer 150 (as in the description) above pertaining to layers 40 and 50 with respect to FIGS. 6E-6F and steps AE and AF in FIG. 7. The PCM material upper electrode layer 140 and the conductive encapsulating layer 150 form a horizontally extending planar region on the surface of the substrate 12. The PCM material upper electrode layer 140 contacts the exposed top surfaces of the bottom vias/electrodes 30 and 130 that were formed in the lower via holes 26 and 126 respectively thereby providing electrical contact with the top surfaces of the lower electrically conductive vias M0.

FIG. 8C shows a cross-sectional view of the PCM cell 110 of FIG. 8B after performance of the step BC in FIG. 9 of depositing and patterning of a sacrificial SM mask 160 with a set of openings 161 and 163 therethrough. In this instance, the continuous conductive encapsulating layer 150 and the PCM material upper electrode layer 140 therebelow are exposed by the opening 161 which is aligned above the central pass-through via/contact 130. The opening 161 combined with openings 163 define the periphery of the PCM cells ME1 and ME3 which are to be formed in step BD.

FIG. 8D shows the PCM cell 110 of FIG. 13 after performance of step BD in FIG. 9 wherein the resistivity of the PCM upper electrode layer 140 and the conductive encapsulating layer 150 have been modified to a nonconductive state by ion implantation of ions 162 through openings 161/163 into exposed regions aside from the desired locations of PCM cells ME1 and ME3. The implanted ions 162 convert material in the PCM material upper electrode layer 140 and the conductive encapsulating layer 150 in the exposed regions into insulating materials aside from the sacrificial SM mask 160. The ion implanted, resistive, encapsulating regions 154 of the conductive encapsulating layer 150 and the resistive PCM regions 144 of the of the PCM material upper electrode layer 140 have been modified so as to be nonconductive or weakly conducting regions, i.e. converted to a substantially or completely nonconductive state in accordance with a first embodiment of this invention. The film surface now comprises PCM cells ME1 and ME3 regions of unmodified encapsulating material 152 and unmodified PCM material 142 interspersed among ion implanted, resistive, encapsulating regions 154 and resistive PCM regions 144 where the material which has been modified so as to be nonconductive or weakly conducting, as described above with reference to the first embodiment.

FIG. 8E shows the PCM cell 110 of FIG. 8D after performance of step AE in FIG. 9 comprising stripping of the sacrificial SM mask 160 showing the central resistive region CR (layers 154/144) between the PCM cells ME1 and ME3 and the peripheral resistive regions PR (layers 154/144) aside wherefrom.

FIG. 8F shows the PCM cell 110 of FIG. 8E after performance of step BF in FIG. 9 comprising forming Contact Mask (CM) 170 with an opening window 170W therethrough over a portion of the central resistive region CR (layers 154/144) above the central pass-through via/contact 130. In other words, CM mask 170 leaves the central region of the resistive, encapsulating region 154 and the resistive PCM regions 144 exposed.

FIG. 8G shows the PCM cell 110 of FIG. 8F after performance of step BG in FIG. 9 of removal of a central portion of the resistive, encapsulating region 154 and a central portion of resistive PCM regions 144 opening a central window 140W through the layers 154/144. The removal of the central portion may be accomplished by wet or dry etching through the central opening window 170W in CM mask 170, or some other suitable means.

FIG. 8H shows the PCM cell 110 of FIG. 8G after performance of step BH in FIG. 9 of stripping the CM mask 170 exposing the top surfaces of the remaining resistive regions 154/144, the PCM cells ME1 and ME3, and the central pass-through via/contact 130.

FIG. 8I shows the PCM cell 110 of FIG. 8J after performance of step BI in FIG. 9 of forming an upper dielectric layer 200 patterned with via holes VH over the PCM cells and a pass through hole PTH upper via/contact opening leaving the top surfaces of the cells ME1 and ME3 and the top surface of the central pass-through via/contact 130 exposed by techniques well known to those skilled in the art.

FIG. 8J shows the PCM cell 110 of FIG. 8H after performance of step BJ in FIG. 9 of depositing metallization layer 190 to form the electrically conductive vias 390 reaching down, through the dielectric layer 200 into contact with the PCM cells M1 and M3 and the CV1 via contact 290 reaching down, through the dielectric layer 200 into contact with the central pass-through c via/contact 130 providing contact to interconnection layers formed subsequently and in direct contact with the lower pass through via/contact 130. In this instance, the central via 290 makes direct contact with the conductive lower pass through via/contact 130 below, providing an unswitched pathway for electrical signals between wiring levels above and below the level containing the memory elements.

FIG. 8K shows the PCM cell 110 of FIG. 8J after performance of step BK in FIG. 9 of planarizing the metallization layer 190 to form the upper conductive vias 390 and the upper pass through contact 290 in direct contact with the lower pass through via/contact 130.

Second Alternative Embodiment

Figure 10:
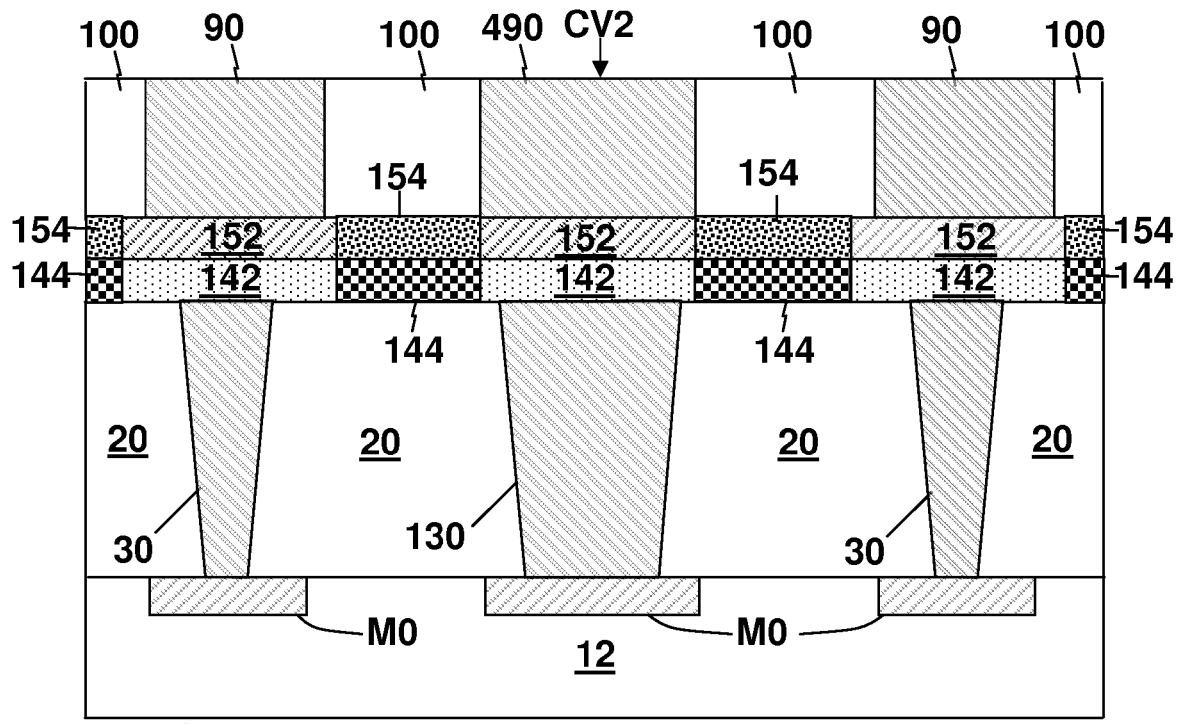
FIG. 10 shows a cross-section view of a second alternative for providing unswitched electrical pathways through the layer containing the memory elements.

FIG. 10 shows an alternate version of the structure introduced in FIG. 8J. In this version, which is intended to illustrate the first of two envisioned methods for integrating the current invention into a device requiring unswitched interconnections between wiring levels above and below the layer incorporating memory cells, the upper center contact 490 of the central pass-through via CV2 is supplied to make such a connection to a lower wiring level and the remaining unmodified encapsulating material 152 and unmodified PCM material 142 are not to become part of a memory cell. In a modification of the process of FIGS. 8A-8K and FIG. 9, the underlying unmodified encapsulating material 152 and unmodified PCM material 142 remains in place, i.e. the underlying unmodified encapsulating material 152 and unmodified PCM material 142 are not removed prior to fabrication of the upper interconnects 490.

Figure 1:
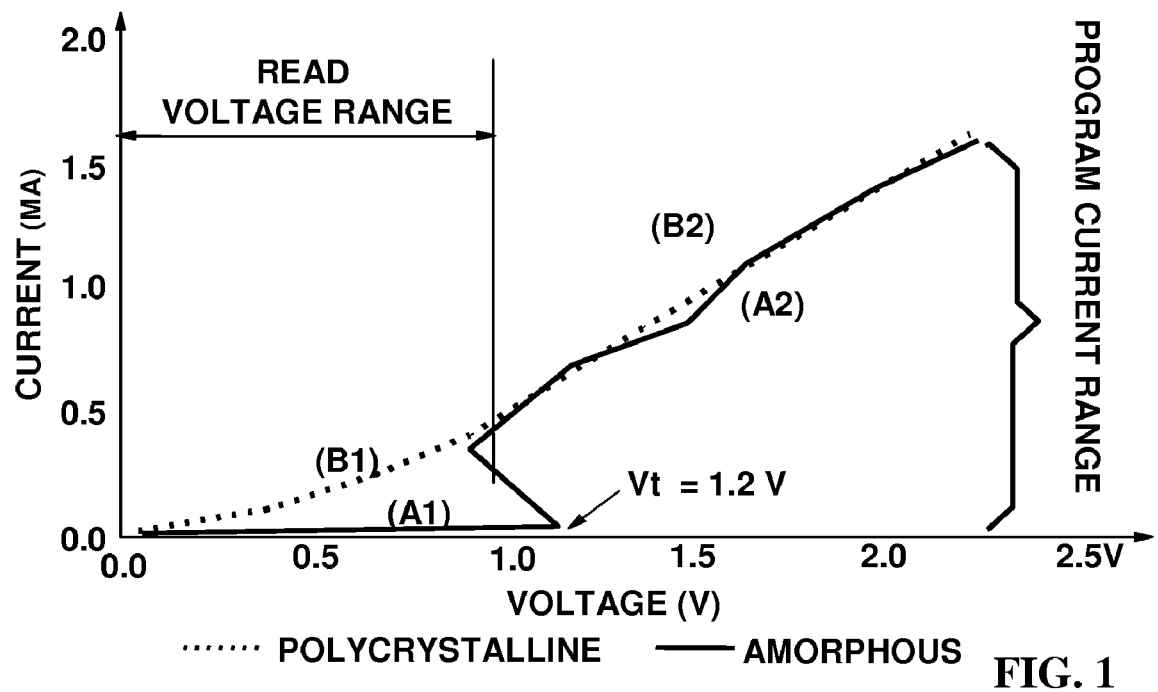
FIG. 1 shows the I-V characteristic of a chalcogenide material in its polycrystalline state which is contrasted with its amorphous state.
Figure 2:
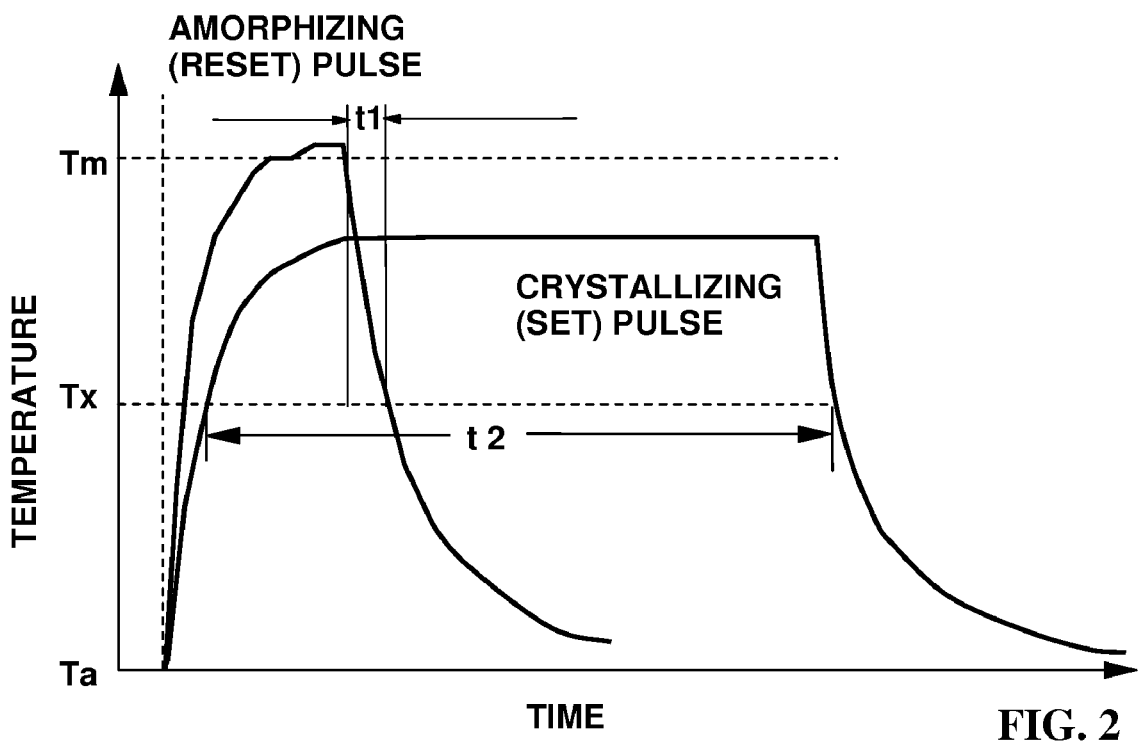
FIG. 2 shows the curves of temperature vs time for an amorphizing RESET pulse and for a crystallizing SET pulse in a chalcogenide memory element.
Figure 11:
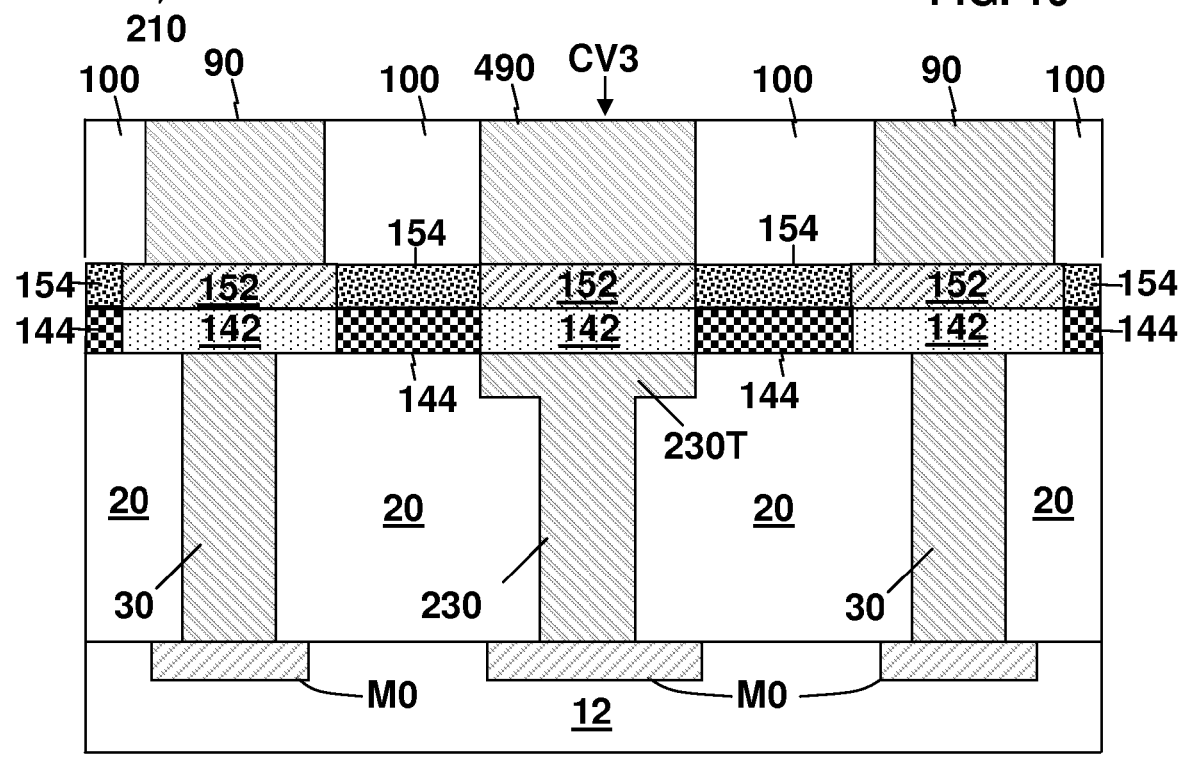
FIG. 11 shows a cross-section view of an alternative example of the structure of FIG. 10, wherein the cross-sectional area of center contact in the region away from the contact to the PCM is allowed to vary as is convenient.

In the second method for passing electrical signals through the horizontally extending planar region of the memory elements, illustrated in FIG. 11, the requirement for high current density to switch the phase change material is exploited selectively to prevent chosen vias from entering the high resistance state. In the central pass-through via CV3, the cross-sectional area top end 230T of the pass-through via/contact 230, where it contacts the PCM layer 142, is made large enough to ensure that there is always insufficient current density entering the PCM material above to switch the state of the PCM material thereby providing continuously conductive contacts. The lower portion of the pass-through via/contact 230 has a reduced cross-sectional area. In this case, there is no need to modify or remove the PCM material from the region of the pass-through contact 490/130, as long as adequate provision is made for ensuring that the PCM material 142 in that region is in the conductive crystalline state at the start of device operation. An anneal to an appropriate temperature as illustrated in FIG. 2 should be sufficient to "SET" all of the pass-through contacts at some convenient point in the wafer processing and packaging flow. As long as the device is not subsequently exposed to a temperature above that required for amorphization (FIG. 2), the pass-through contacts should maintain their low resistance throughout the working lifetime of the device.

Those skilled in the art will recognize that, although FIG. 10 shows a constantly narrowing trapezoidal cross-sectional dimension for the pass-through via/contact 130, it may be advantageous to fabricate the contact with a stepped rectangular shape 230 as illustrated by the central pass-through via CV3 of FIG. 11 or a tapered profile, and doing so will not compromise the function of the pass-through contact as long as the area of contact between the central pass-through CV3 and the PCM material layer 142 is adequate to maintain a sufficiently low current density in that region. Similarly, a structure with a small conductive via capped with a separate, larger bottom electrode at the point of contact with the PCM material would also accomplish the goals of this invention.

The foregoing description discloses only exemplary embodiments of the invention. Modifications of the above disclosed apparatus and methods which fall within the scope of the invention will be readily apparent to those of ordinary skill in the art.

Accordingly, while the present invention has been disclosed in connection with exemplary embodiments thereof, it should be understood that other embodiments may fall within the spirit and scope of the invention, as defined by the following claims.

What is claimed is:

1. A Phase Change Memory (PCM) device comprising:
   a substrate having an upper surface and including a set of electrical via conductors formed therein having exposed top surfaces;
   a PCM material layer formed on said upper surface in electrical contact with said exposed top surfaces of said via conductors;
   an encapsulating layer composed of an electrically conductive material formed on top of said PCM material layer;
   a set of PCM cells formed by portions of said encapsulating layer and portions of said PCM material layer in contact with said top surface of said electrical conductors; and
   said PCM cells being separated by high electrical resistance, modified regions of said PCM material layer and high electrical resistance, modified regions of said encapsulating layer.

2. The Phase Change Memory (PCM) device of claim 1 wherein:
   said encapsulating layer is composed of material selected from the group consisting of conductors and semiconductor materials; and
   said PCM material layer is composed of a chalcogenide material.

3. The Phase Change Memory (PCM) device of claim 1 wherein said high electrical resistance regions of said PCM material layer and said high electrical resistance regions of said encapsulating layer comprise ion implanted and annealed regions.

4. The Phase Change Memory (PCM) device of claim 3 wherein said ions are selected from the group consisting of oxygen, nitrogen, and carbon.

5. The Phase Change Memory (PCM) device of claim 2 wherein said high electrical resistance regions of said PCM material layer and said high electrical resistance regions of said encapsulating layer comprise oxygen ion implanted and annealed regions.

6. The Phase Change Memory (PCM) device of claim 5 wherein said ions are selected from the group consisting of oxygen, nitrogen, and carbon.

7. The Phase Change Memory (PCM) device of claim 1 wherein a central via which serves as a pass-through contact is juxtaposed with a pair of said PCM cells.

8. The Phase Change Memory (PCM) device of claim 1 wherein a central via which serves as a pass-through contact is juxtaposed with a pair of said PCM cells with said central via including via conductors in series with unmodified regions of said PCM material layer and unmodified regions of said encapsulating layer.

9. A Phase Change Memory (PCM) device comprising:
a dielectric layer having an upper surface;
a set of electrical via conductors extending through said dielectric layer to said upper surface;
each of said electrical via conductors having top surfaces;
a PCM material layer formed on said upper surface in electrical contact with said top surfaces of said via conductors;
an encapsulating layer composed of an electrically conductive material formed on top of said PCM material layer;
a set of PCM cells formed by portions of said encapsulating layer and portions of said PCM material layer in contact with said top surface of said via conductors; and
said PCM cells being separated by high electrical resistance, modified regions of said PCM material layer and high electrical resistance, modified regions of said encapsulating layer.

10. The Phase Change Memory (PCM) device of claim 9 wherein said high electrical resistance regions of said PCM material layer and said high electrical resistance regions of said encapsulating layer comprise oxygen ion implanted and annealed regions.

11. The Phase Change Memory (PCM) device of claim 9 wherein said high electrical resistance regions of said PCM material layer and high electrical resistance regions of said encapsulating layer comprise insulating material.

12. The Phase Change Memory (PCM) device of claim 9 wherein said high electrical resistance regions of said PCM material layer and high electrical resistance regions of said encapsulating layer have been implanted with ions.

13. The Phase Change Memory (PCM) device of claim 12 wherein said high electrical resistance regions of said PCM material layer and high electrical resistance regions of said encapsulating layer comprise insulating material.

14. The Phase Change Memory (PCM) device of claim 9 wherein:
said encapsulating conductive material layer is composed of material selected from the group consisting of conductors and semiconductor materials; and
said PCM material layer is composed of a chalcogenide material.

15. The Phase Change Memory (PCM) device of claim 14 wherein said ions are selected from the group consisting of oxygen, nitrogen, and carbon.

16. The Phase Change Memory (PCM) device of claim 14 wherein said high electrical resistance regions of said PCM material layer and high electrical resistance regions of said encapsulating layer comprise insulating material.

17. The Phase Change Memory (PCM) device of claim 14 wherein said high electrical resistance regions of said PCM material layer and said high electrical resistance regions of said encapsulating layer have been implanted with ions.

18. The Phase Change Memory (PCM) device of claim 17 wherein said high electrical resistance regions of said PCM material layer and high electrical resistance regions of said encapsulating layer comprise insulating material.

19. The Phase Change Memory (PCM) device of claim 17 wherein said ions are selected from the group consisting of oxygen, nitrogen, and carbon.

20. The Phase Change Memory (PCM) device of claim 19 wherein said high electrical resistance regions of said PCM material layer and said high electrical resistance regions of said encapsulating layer comprise oxygen ion implanted and annealed regions.

* * * * *